(12) United States Patent
Inoue

(10) Patent No.: US 10,672,916 B2
(45) Date of Patent: Jun. 2, 2020

(54) SEMICONDUCTOR DEVICE HAVING A MEMORY AND MANUFACTURING METHOD THEREOF

(71) Applicant: RENESAS ELECTRONICS CORPORATION, Tokyo (JP)

(72) Inventor: Masao Inoue, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/126,784

(22) Filed: Sep. 10, 2018

(65) Prior Publication Data
US 2019/0148562 A1    May 16, 2019

(30) Foreign Application Priority Data
Nov. 15, 2017   (JP) ................. 2017-220209

(51) Int. Cl.
*H01L 29/792* (2006.01)
*H01L 27/11568* (2017.01)
(Continued)

(52) U.S. Cl.
CPC .......... *H01L 29/792* (2013.01); *H01L 21/022* (2013.01); *H01L 21/0214* (2013.01);
(Continued)

(58) Field of Classification Search
CPC ............... H01L 29/792; H01L 21/0214; H01L 21/02164; H01L 21/02148; H01L 21/02178; H01L 21/02181
See application file for complete search history.

(56) References Cited

U.S. PATENT DOCUMENTS 9,685,565 B2    6/2017  Mizutani et al.
2006/0220106 A1  10/2006 Choi et al.
(Continued)

FOREIGN PATENT DOCUMENTS

JP    2015-053474 A    3/2015

OTHER PUBLICATIONS

Extended European Search Report issued in corresponding European Patent Application No. 18196129.3-1212, dated Mar. 25, 2019.

*Primary Examiner* — Phuc T Dang
(74) *Attorney, Agent, or Firm* — McDermott Will & Emery LLP

(57) ABSTRACT

The performances of a semiconductor device of a memory element are improved. Over a semiconductor substrate, a gate electrode for memory element is formed via overall insulation film of gate insulation film for memory element. The overall insulation film has first insulation film, second insulation film over first insulation film, third insulation film over second insulation film, fourth insulation film over third insulation film, and fifth insulation film over fourth insulation film. The second insulation film is an insulation film having charge accumulation function. Each band gap of first insulation film and third insulation film is larger than the band gap of second insulation film. The third insulation film is polycrystal film including high dielectric constant material containing metallic element and oxygen. Fifth insulation film is polycrystal film including the same material as that for third insulation film. Fourth insulation film includes different material from that for third insulation film.

18 Claims, 24 Drawing Sheets

(51) Int. Cl.
*H01L 29/51* (2006.01)
*H01L 29/423* (2006.01)
*H01L 29/66* (2006.01)
*H01L 21/02* (2006.01)
*H01L 21/28* (2006.01)

(52) U.S. Cl.
CPC .. *H01L 21/02145* (2013.01); *H01L 21/02148* (2013.01); *H01L 21/02164* (2013.01); *H01L 21/02178* (2013.01); *H01L 21/02181* (2013.01); *H01L 21/02356* (2013.01); *H01L 27/11568* (2013.01); *H01L 29/40117* (2019.08); *H01L 29/4234* (2013.01); *H01L 29/42364* (2013.01); *H01L 29/513* (2013.01); *H01L 29/517* (2013.01); *H01L 29/518* (2013.01); *H01L 29/66833* (2013.01)

(56) References Cited

U.S. PATENT DOCUMENTS

| | | |
|---|---|---|
| 2009/0078990 A1 | 3/2009 | Yasuda |
| 2009/0239367 A1 | 9/2009 | Kim et al. |
| 2011/0086485 A1* | 4/2011 | Endoh .................. C23C 16/345 438/287 |
| 2017/0077111 A1* | 3/2017 | Ohba ................ H01L 27/11524 |

* cited by examiner

| OPERATION \ APPLIED VOLTAGE | Vd | Vcg | Vmg | Vs | Vb |
|---|---|---|---|---|---|
| WRITE | 0.5V | 1V | 7V | 3.5V | 0 |
| ERASE | 0 | 0 | 8.4V | 0 | 0 |
| READ | 1.5V | 1.5V | 0 | 0 | 0 |

SEMICONDUCTOR DEVICE HAVING A MEMORY AND MANUFACTURING METHOD THEREOF

CROSS-REFERENCE TO RELATED APPLICATIONS

The disclosure of Japanese Patent Application No. 2017-220209 filed on Nov. 15, 2017 including the specification, drawings and abstract is incorporated herein by reference in its entirety.

BACKGROUND

The present invention relates to a semiconductor device and a manufacturing method thereof, and is preferably applicable to, for example, a semiconductor device having a memory element, and a manufacturing method thereof.

As electrically writable/erasable nonvolatile semiconductor storage devices, EEPROMs (Electrically Erasable and Programmable Read Only Memories) have been widely used. The storage devices typified by currently and widely used flash memories have conductive floating gate electrodes surrounded by an oxide film, or trapping insulation films under gate electrodes of MISFETs. The storage devices use charge accumulation states at the floating gates or the trapping insulation film as stored information, and read out the information as a threshold value of each transistor. The trapping insulation film denotes an insulation film capable of accumulating electric charges. As one example thereof, mention may be made of a silicon nitride film. Injection/discharge of electric charges into such charge accumulation regions causes each MISFET (Metal Insulator Semiconductor Field Effect Transistor) to be shifted in threshold value and to operate as a storage element. Such a memory has the following advantages: use of a trapping insulation film such as a silicon nitride film as a charge accumulation region leads to more excellent data holding reliability because electric charges are accumulated discretely as compared with the case where a conductive floating gate is used as a charge accumulation region; further, the excellent data holding reliability can reduce the film thicknesses of the oxide films over and under the silicon nitride film, which enables a lower voltage for write/erase operation; and other advantages.

Japanese Unexamined Patent Application Publication No. 2015-53474 (Patent Document 1) describes the technology of applying a high dielectric constant insulation film to a gate insulation film for a memory element.

CITED DOCUMENT

[Patent Document 1] Japanese Unexamined Patent Application Publication No. 2015-53474

SUMMARY

A semiconductor device having a memory element has been desired to be improved in performances as much as possible.

Other objects and novel features will be apparent from the description of this specification and the accompanying drawings.

In accordance with one embodiment, in a semiconductor device, a gate insulation film for memory element has a first insulation film, a second insulation film over the first insulation film, a third insulation film over the second insulation film, a fourth insulation film over the third insulation film, and a fifth insulation film over the fourth insulation film. The second insulation film is an insulation film having a charge accumulation function. Respective band gaps of the first insulation film and the third insulation film are larger than the band gap of the second insulation film. The third insulation film is a polycrystal film formed of a high dielectric constant material containing a metallic element and oxygen. The fifth insulation film is apolycrystal film formed of the same material as that for the third insulation film. The fourth insulation film is formed of a different material from that for the third insulation film.

In accordance with one embodiment, the performances of a semiconductor device can be improved.

DETAILED DESCRIPTION

Figure 1:
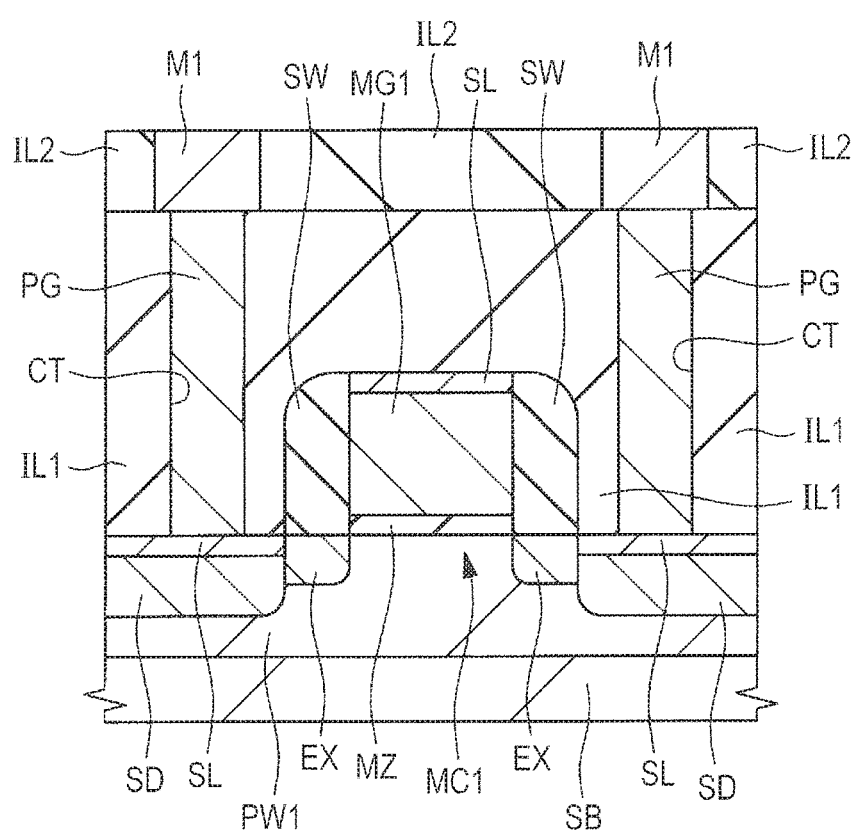
FIG. 1 is an essential part cross sectional view of a semiconductor device of one embodiment.

In description of the following embodiment, the embodiment may be described in a plurality of divided sections or embodiments for convenience, if required. However, unless otherwise specified, these are not independent of each other, but are in a relation such that one is a modified example, details, a complementary explanation, or the like of a part or the whole of the other. Further, in the following embodiments, when a reference is made to the number of elements, and the like (including number, numerical value, quantity, range, or the like), the number of elements, or the like is not limited to the specific number, but may be greater than or less than the specific number, unless otherwise specified, except for the case where the number is apparently limited to the specific number in principle, or except for other cases.

Further, in the following embodiments, it is needless to say that the constitutional elements (including element steps, or the like) are not always essential, unless otherwise specified, and except for the case where they are apparently considered essential in principle, or except for other cases. Similarly, in the following embodiments, when a reference is made to the shapes, positional relationships, or the like of the constitutional elements, or the like, it is understood that they include ones substantially analogous or similar to the shapes or the like, unless otherwise specified, and unless otherwise considered apparently in principle, or except for other cases. This also applies to the foregoing numerical values and ranges.

Below, the embodiments will be described in details by reference to the accompanying drawings. Incidentally, in all the drawings for describing the embodiments, the members having the same function are given the same reference signs and numerals, and a repeated description thereon is omitted. Further, in the following embodiments, a description on the same or similar part will not be repeated in principle unless otherwise required.

Further, in drawings for use in the embodiments, hatching may be omitted even in a cross sectional view for ease of understanding of the drawing. Whereas, hatching may be added even in a plan view for ease of understanding of the drawing.

First Embodiment

<Single Gate Type Memory Element>

Figure 2:
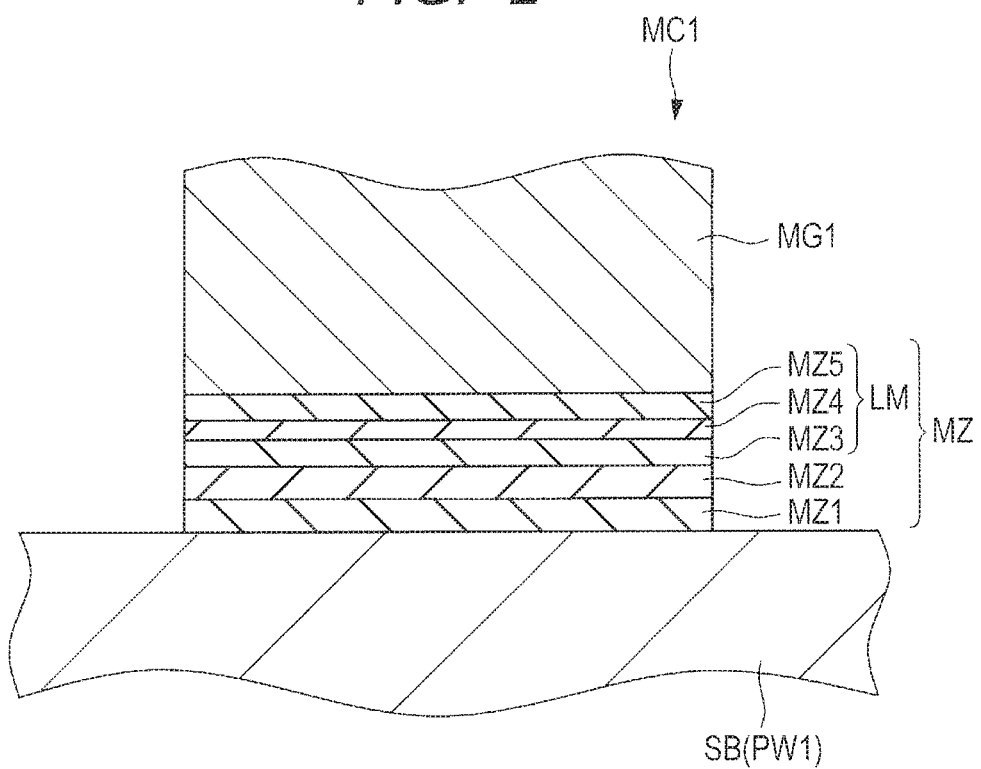
FIG. 2 is a partially enlarged cross sectional view of the semiconductor device of FIG. 1.

A semiconductor device of the present embodiment will be described by reference to the accompanying drawings. FIG. 1 is an essential part cross sectional view of the semiconductor device of the present embodiment. FIG. 2 is a partially enlarged cross sectional view showing a part of the semiconductor device of FIG. 1 on an enlarged scale.

The semiconductor device of the present embodiment is a semiconductor device including a nonvolatile memory (nonvolatile storage element, flash memory, or nonvolatile semiconductor storage device). FIG. 1 shows an essential part cross sectional view of a memory element formation region of a region where a memory element (storage element) MC1 forming the nonvolatile memory is formed. Incidentally, FIG. 1 shows a cross section perpendicular to the direction of extension of the gate electrode MG1 forming the memory element MC1 (the direction perpendicular to the paper plane of FIG. 1). Further, FIG. 2 shows a semiconductor substrate SB, a gate electrode MG1, and an insulation film MZ therebetween of FIG. 1 on an enlarged sale.

For the memory element MC1, a trapping insulation film (insulation film capable of accumulating electric charges) is used as the charge accumulation part. Further, a description will be given with the memory element MC1 as an n channel type transistor. However, by inverting the conductivity type, the memory element MC1 may be assumed to be a p channel type transistor.

As shown in FIG. 1, in the semiconductor substrate (semiconductor wafer) SB formed of, for example, a p type single crystal silicon having a specific resistance of about 1 to 10 acm, an element isolation region (not shown) for isolating elements is formed. A p type well PW1 is formed in an active region defined by the element isolation region. The p type well is a p type semiconductor region doped with a p type impurity. The p type well PW1 is formed mainly in the semiconductor substrate SB in a memory element formation region. In the p type well PW1 in the memory element formation region, the memory element MC1 as shown in FIG. 1 is formed.

Below, the configuration of the memory element MC1 formed in the memory element formation region will be described specifically.

As shown in FIG. 1, the memory element MC1 has an insulation film MZ formed over the semiconductor substrate SB (i.e., over the p type well PW1), a gate electrode MG1 formed over the insulation film MZ, a sidewall spacer SW formed over the sidewall of the gate electrode MG1, and an n type semiconductor region (EX or SD) for source or drain formed in the p type well PW1 of the semiconductor substrate SB. That is, over the surface of the p type well PW1, the gate electrode MG1 is formed via the insulation film MZ.

The insulation film MZ is an insulation film interposed between the semiconductor substrate SB (p type well PW1) and the gate electrode MG1, and functioning as a gate insulation film, and having a charge accumulation part in the inside thereof. The insulation film MZ is a lamination insulation film of a plurality of insulation films stacked one over another. Specifically, the insulation film MZ is formed of a lamination film of an insulation film MZ1, an insulation film MZ2 formed over the insulation film MZ1, an insulation film MZ3 formed over the insulation film MZ2, an insulation film MZ4 formed over the insulation film MZ3, and an insulation film MZ5 formed over the insulation film MZ4.

Herein, the insulation film MZ1 is preferably formed of a silicon oxide film (oxide film) or a silicon oxynitride film (oxynitride film). Further, the insulation film MZ2 is formed of a material (high dielectric constant material) containing hafnium (Hf) and oxygen (O), and is preferably formed of a hafnium oxide film (typically, a $HfO_2$ film) or a hafnium silicate film ($Hf_xSi_{1-x}O_2$ film). Further, the insulation film MZ3 is a polycrystal film formed of a material (high dielectric constant material) containing a metal (metallic element) and oxygen (O) (as constituent elements), and is preferably formed of an aluminum oxide film (typically, an $Al_2O_3$ film), an aluminum oxynitride film (AlON film), or an aluminum silicate film (AlSiO film), and is particularly preferably formed of an aluminum oxide film. The insulation film MZ4 is formed of a different material from that for the insulation film MZ3. Further, the insulation film MZ5 is a polycrystal film formed of the same material (high dielectric constant material) as that for the insulation film MZ3. For this reason, the insulation film MZ3 and the insulation film MZ5 are polycrystal films formed of the mutually same material. When the insulation film MZ3 is a polycrystal film formed of aluminum oxide, the insulation film MZ5 is also a polycrystal film formed of aluminum oxide. The insulation film MZ5 is adjacent to the gate electrode MG1.

Incidentally, for ease of understanding of the drawing, in FIG. 1, the insulation film MZ formed of a lamination film of the insulation film MZ1, the insulation film MZ2, the insulation film MZ3, the insulation film MZ4, and the insulation film MZ5 is shown simply as the insulation film MZ. However, actually, as shown in the enlarged view of FIG. 2, the insulation film MZ is formed of a lamination film of the insulation film MZ1, the insulation film MZ2, the insulation film MZ3, the insulation film MZ4, and the insulation film MZ5.

Of the insulation film MZ, the insulation film MZ2 is an insulation film having a charge accumulation function. That is, of the insulation film MZ, the insulation film MZ2 is an insulation film for accumulating electric charges, and functions as a charge accumulation layer (charge accumulation part). In other words, the insulation film MZ2 is a trapping insulation film formed in the insulation film MZ. Herein, the trapping insulation film denotes an insulation film capable of accumulating electric charges. Thus, as the insulation film (charge accumulation layer) having a trap level, the insulation film MZ2 is used. For this reason, the insulation film MZ can be regarded as an insulation film having a charge accumulation part (herein, the insulation film MZ2) in the inside thereof.

Of the insulation film MZ, the insulation film MZ3 and the insulation film MZ1 situated over and under the insulation film MZ2 of a trapping insulation film can each function as a charge block layer (charge confining layer) for confining electric charges in the trapping insulation film. In the insulation film MZ between the gate electrode MG1 and the semiconductor substrate SB (p type well PW1), the insulation film MZ2 of a trapping insulation film is interposed between the insulation films MZ1 and MZ3 each functioning a charge block layer (or a charge confining layer). Adoption of this structure enables accumulation of electric charges into the insulation film MZ2.

The insulation film MZ has a structure in which the charge accumulation layer (herein, the insulation film MZ2) is interposed between the charge block layers (herein, the insulation films MZ1 and MZ3) so as to function as a gate insulation film having a charge holding function of the memory element MC1. The potential barrier heights of the charge block layers (herein, the insulation films MZ1 and MZ3) are higher than the potential barrier height of the charge accumulation layer (herein, the insulation film MZ2). In other words, respective band gaps of the insulation film MZ1 and the insulation film MZ3 are larger than the band gap of the insulation film MZ2. This can be achieved by forming the insulation films MZ1, MZ2, and MZ3 with the foregoing materials. That is, a silicon oxide film, a silicon oxynitride film, an aluminum oxide film, an aluminum oxynitride film, and an aluminum silicate film each have a larger band gap than the band gaps of a hafnium oxide film and a hafnium silicate film, and hence can be each adopted as a charge block layer.

The insulation film MZ has a lamination structure in which the charge accumulation layer (herein, the insulation film MZ2) is interposed between the top insulation film and the bottom insulation film. In the present embodiment, as the top insulation film, a lamination film LM of the insulation film MZ3, the insulation film MZ4, and the insulation film MZ5 is used, and the insulation film MZ1 is used as the bottom insulation film.

The insulation film MZ2, the insulation film MZ3, and the insulation film MZ5 are each an insulating material film having a higher dielectric constant (specific dielectric constant) than that of silicon oxide, a so-called High-k film (a high dielectric constant film, or a high dielectric constant insulation film). Incidentally, in the present application, the term "High-k film, high dielectric constant film, high dielectric constant insulation film, high dielectric constant gate insulation film, or high dielectric constant material" herein used denotes a film or material having a higher dielectric constant (specific dielectric constant) than that of silicon oxide. An aluminum oxide film, an aluminum oxynitride film, an aluminum silicate film, a hafnium oxide film, and a hafnium silicate film are all high dielectric constant insulation films, and each have a higher dielectric constant (specific dielectric constant) than that of silicon oxide. Further, a high dielectric constant film is a film having a higher dielectric constant than that of silicon oxide as described above, and more preferably has a higher dielectric constant than that of silicon nitride.

The gate electrode MG1 is formed of a conductive film, and herein, is formed of a silicon film. The silicon film is preferably a polysilicon (polycrystal silicon) film. A silicon film forming the gate electrode MG1 can be formed as a doped polysilicon film doped with an n type impurity. However, as another aspect, the silicon film can be formed as a doped polysilicon film doped with a p type impurity, or a nondoped polysilicon film not intentionally doped with an impurity.

Over each sidewall of the gate electrode MG1, a sidewall spacer SW is formed as a sidewall insulation film. The sidewall spacer SW is formed of an insulation film, and is formed of, for example, a silicon oxide film, or a silicon nitride film, or a lamination film thereof.

In a p type well PW1 in the memory element formation region, $n^-$ type semiconductor regions (extension regions or LDD regions) EX, and $n^+$ type semiconductor regions (source/drain regions) SD having a higher impurity density than that are formed as the source/drain region (semiconductor region for source or drain) of a LDD (Lightly doped Drain) structure for the memory element MC1. The $n^+$ type semiconductor region SD is higher in impurity density, and deeper in junction depth than the $n^-$ type semiconductor region EX.

The $n^-$ type semiconductor region EX is formed in self-alignment with the gate electrode MG1. The $n^+$ type semiconductor region SD is formed in self-alignment with the sidewall spacer SW provided over the sidewall of the gate electrode MG1. For this reason, the low-density $n^-$ type semiconductor region EX is formed under the sidewall spacer SW over the sidewall of the gate electrode MG1, and the high-density $n^+$ type semiconductor region SD is formed outside the low-density $n^-$ type semiconductor region EX. That is, the $n^-$ type semiconductor region EX is situated under the sidewall spacer SW formed over the sidewall of the gate electrode MG1, and is interposed between the channel formation region and the $n^+$ type semiconductor region SD.

The region under the gate electrode MG1 in the semiconductor substrate SB (p type well PW1) becomes a region where the channel is formed, namely, a channel formation region. In the channel formation region under the insulation film MZ under the gate electrode MG1, a semiconductor region (p type semiconductor region or n type semiconductor region) for adjusting the threshold voltage is formed, if required.

In the semiconductor substrate SB (p type well PW1) in the memory element formation region, in the regions separated from each other across the channel formation region, the $n^-$ type semiconductor regions EX are formed, respectively. Outside each $n^-$ type semiconductor region EX (on the side away from the channel formation region), the $n^+$ type semiconductor region SD is formed. In other words, each $n^-$ type semiconductor region EX is adjacent to the channel formation region, and each $n^+$ type semiconductor region SD is formed at a position separated from the channel formation region by the $n^-$ type semiconductor region EX (separated in the channel length direction), and in contact with the $n^-$ type semiconductor region EX.

Over each surface (upper surface) of each $n^+$ type semiconductor region SD and the gate electrode MG1, a metal silicide layer SL is more preferably formed using a Salicide (Self Aligned Silicide) technology. The metal silicide layer SL can be formed as a cobalt silicide layer, a nickel silicide layer, a platinum-doped nickel silicide layer, or the like. The formation of the metal silicide layer SL may be omitted, if not required.

Then, a description will be given to the structure of layers higher than the memory element MC1.

Over the semiconductor substrate SB, an insulation film IL1 is formed as an interlayer insulation film in such a manner as to cover the gate electrode MG1 and the sidewall spacers SW. The upper surface of the insulation film IL1 is planarized. In the insulation film IL1, contact holes (through holes) CT are formed. In each contact hole CT, a conductive plug PG is buried as a coupling conductor part.

Each contact hole CT and the plug PG buried therein are formed over the $n^+$ type semiconductor region SD, over the gate electrode MG1, and the like. At the bottom of each contact hole CT, a part of the main surface of the semiconductor substrate SB, such as a part of the metal silicide layer SL over the surface of the $n^+$ type semiconductor region SD, or a part of the metal silicide layer SL over the surface of the gate electrode MG1 is exposed. The plug PG is coupled to the exposed part.

Over the insulation film IL1 including the plug PG buried therein, a wire M1 is formed. The wire M1 is, for example, a damascene wire (buried wire), and is buried in a wiring trench provided in the insulation film IL2 formed over the insulation film IL1. The wire M1 is electrically coupled via the plug PG with the $n^+$ type semiconductor region SD, the gate electrode MG1, or the like. Wires and insulation films at still higher layers are also formed, but herein, are not shown and are not described. Further, the wire M1 and wires at higher layers than that are not limited to damascene wires (buried wires), and can also be formed by patterning a wiring conductor film. For example, a tungsten wire or an aluminum wire is also acceptable.

The memory element MC1 is a field effect transistor including a gate insulation film (herein, the insulation film MZ) having a charge accumulation part in the inside thereof. The memory element MC1 accumulates or holds electric charges in the insulation film MZ2 of the charge accumulation part in the insulation film MZ, and thereby can store information.

For example, at the time of the write operation of the memory element MC1, electrons are injected into the insulation film MZ2 in the insulation film MZ, thereby to put the memory element MC1 into the write state. Herein, by injecting electrons from the semiconductor substrate (p type well PW1) into the insulation film MZ2 in the insulation film MZ, it is possible to put the memory element MC1 into the write state. Whereas, at the time of the erase operation of the memory element MC1, electrons are extracted from the insulation film MZ2 in the insulation film MZ, or holes are injected into the insulation film MZ2 in the insulation film MZ, thereby to put the memory element MC1 into the erase state. Herein, by injecting holes from the gate electrode MG1 into the insulation film MZ2 in the insulation film MZ, it is possible to put the memory element MC1 into the erase state. The injection of electric charges (herein, holes) from the gate electrode MG1 into the insulation film MZ2 in the insulation film MZ at the time of the erase operation can be performed using FN (Fowler Nordheim) tunneling. At the time of the read operation of the memory element MC1, it is possible to determine whether the memory element MC1 is in the write state, or in the erase state using the fact that the threshold voltage of the memory element MC1 varies between the write state and the erase state.

Then, a description will be given to a method for manufacturing a semiconductor device of the present embodiment.

Figure 3:
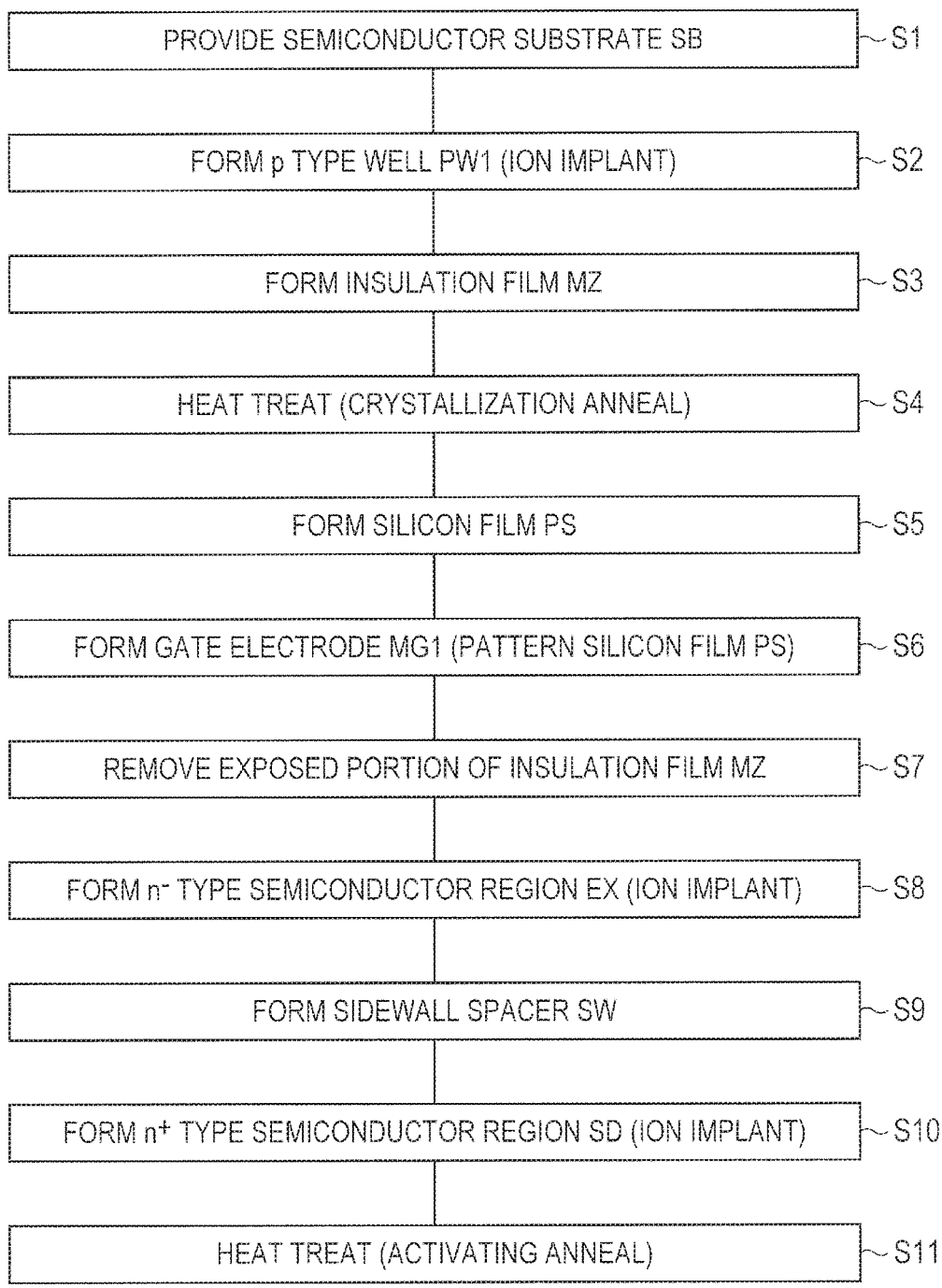
FIG. 3 is a process flowchart showing some of the manufacturing steps of the semiconductor device of one embodiment.

FIG. 3 is a process flowchart showing some of the manufacturing steps of the semiconductor device of the present embodiment. FIGS. 4 to 14 are each an essential part cross sectional view of the semiconductor device of the present embodiment during a manufacturing step, and each show a cross sectional view of the region corresponding to FIG. 1.

Figure 4:
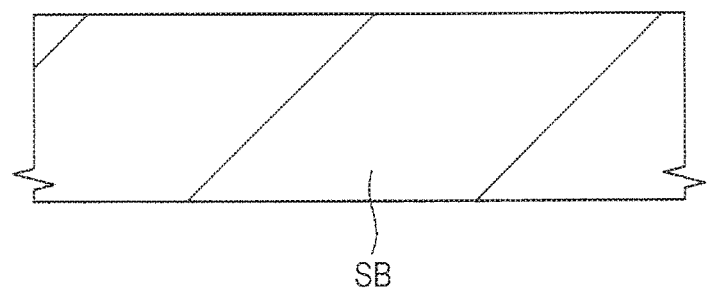
FIG. 4 is an essential part cross sectional view of the semiconductor device of one embodiment during a manufacturing step.

For manufacturing a semiconductor device, as shown in FIG. 4, first, a semiconductor substrate (semiconductor wafer) SB formed of, for example, a p type single crystal silicon having a specific resistance of about 1 to 10 Scm is provided (Step S1 of FIG. 3). Then, at the main surface of the semiconductor substrate SB, an element isolation region (not shown) for defining an active region is formed. The element isolation region is formed of an insulation film such as silicon oxide, and can be formed by using, for example, the STI (Shallow Trench Isolation) method.

Figure 5:
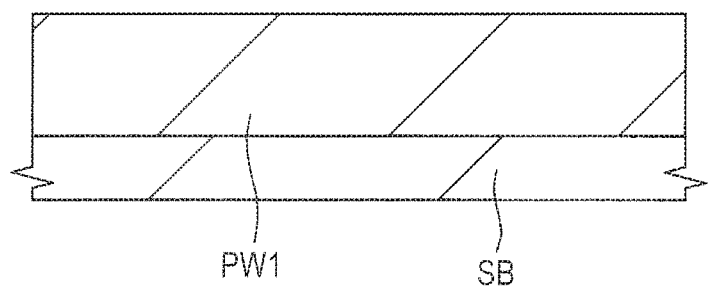
FIG. 5 is an essential part cross sectional view of the semiconductor device during a manufacturing step following FIG. 4.

Then, as shown in FIG. 5, in the semiconductor substrate SB in the memory element formation region, a p type well PW1 is formed (Step S2 of FIG. 3). The p type well PW1 can be formed by ion implanting a p type impurity such as boron (B) into the semiconductor substrate SB, or by other methods. The p type well PW1 is formed from the main surface of the semiconductor substrate SB to a prescribed depth.

Then, for example, by wet etching using a hydrofluoric acid (HF) aqueous solution, or the like, the natural oxide film at the surface of the semiconductor substrate SB is removed, thereby to clean and purify the surface of the semiconductor substrate SB. As a result, the surface (silicon surface) of the semiconductor substrate SB (p type well PW1) is exposed.

Figure 6:
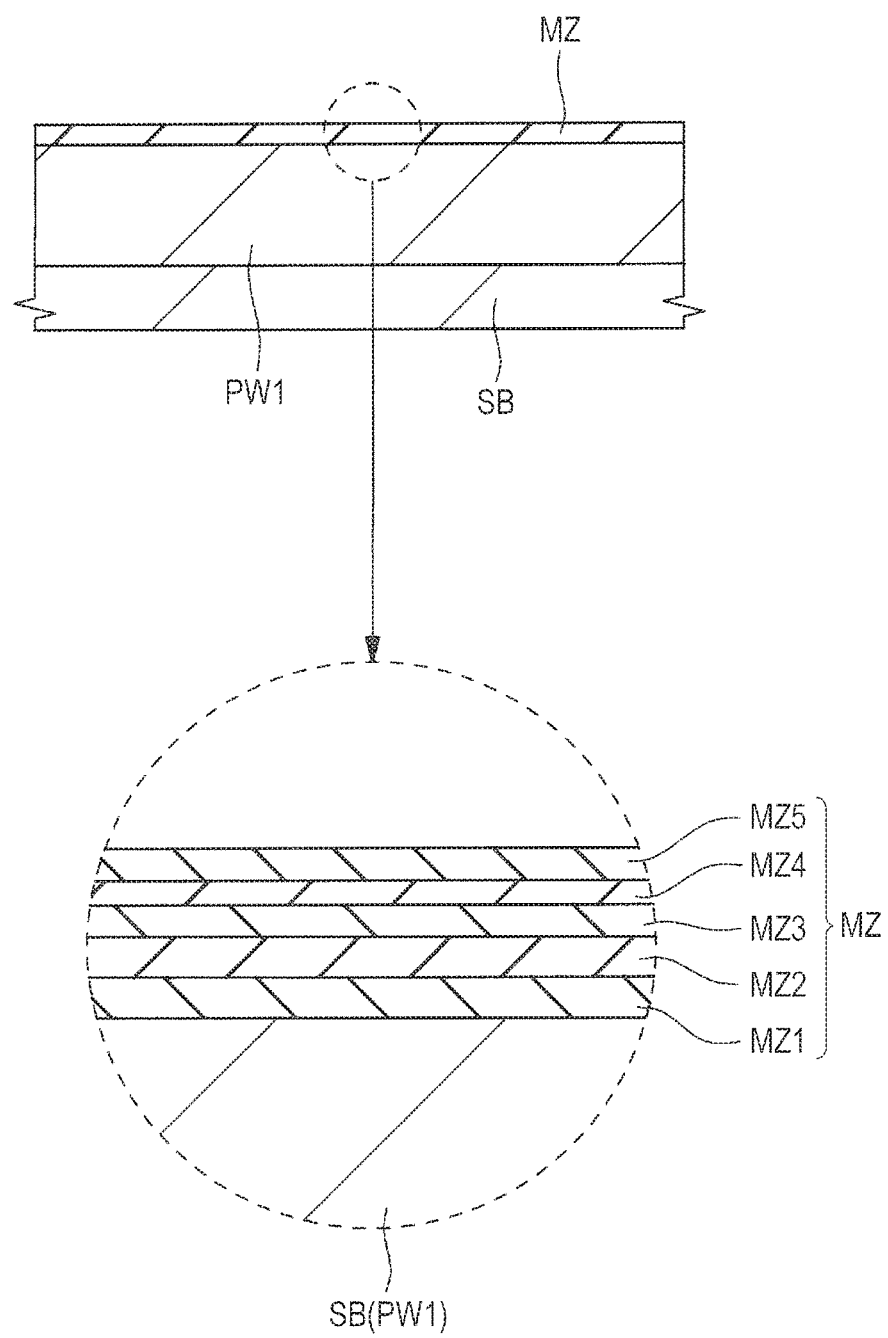
FIG. 6 is an essential part cross sectional view of the semiconductor device during a manufacturing step following FIG. 5.

Then, as shown in FIG. 6, over the surface of the semiconductor substrate SB, namely, over the surface of the p type well PW1, the insulation film MZ is formed (Step S3 of FIG. 3).

The insulation film MZ is an insulation film for the gate insulation film of a memory element, and an insulation film having a charge accumulation layer (charge accumulation part) in the inside thereof. The insulation film MZ is formed of a lamination film (lamination insulation film) having an insulation film MZ1, an insulation film MZ2 formed over the insulation film MZ1, an insulation film MZ3 formed over the insulation film MZ2, an insulation film MZ4 formed over the insulation film MZ3, and an insulation film MZ5 formed over the insulation film MZ4.

Incidentally, for ease of understanding of the drawing, in FIG. 6, the insulation film MZ including the insulation film MZ1, the insulation film MZ2, the insulation film MZ3, the insulation film MZ4, and the insulation film MZ5 is simply shown as the insulation film MZ. However, actually, as shown in the enlarged view of the region surrounded by a dotted line circle in FIG. 6, the insulation film MZ is formed of a lamination film of the insulation film MZ1, the insulation film MZ2, the insulation film MZ3, the insulation film MZ4, and the insulation film MZ5.

For this reason, the insulation film MZ formation step of Step S3 includes the insulation film MZ1 formation step, the insulation film MZ2 formation step, the insulation film MZ3 formation step, the insulation film MZ4 formation step, and the insulation film MZ5 formation step. The steps are performed in this order.

A description will be given to a specific example of the insulation film MZ formation step of Step S3. The insulation film MZ formation step of Step S3 can be performed in the following manner.

First, over the surface of the semiconductor substrate SB, namely, over the surface of the p type well PW1, the insulation film MZ1 is formed.

The insulation film MZ1 is formed of a silicon oxide film, and can be formed by a thermal oxidation treatment. For the oxidation treatment (thermal oxidation treatment) at this step, ISSG (In Situ Steam Generation) oxidation is more preferably used. As another aspect, the following is also acceptable: a silicon oxide film (insulation film MZ1) is formed by thermal oxidation; then, a thermal nitriding treatment or a plasma nitriding treatment can be performed, thereby to nitride the silicon oxide film (insulation film MZ1) for introduction of nitrogen. The film thickness (formed film thickness) of the insulation film MZ1 can be set at, for example, about 2 to 5 nm.

Then, over the insulation film MZ1, the insulation film MZ2 is formed. The insulation film MZ2 is formed of a material containing hafnium (Hf) and oxygen (O) (high dielectric constant material), preferably formed of a hafnium oxide film or a hafnium silicate film, and can be formed using the LPCVD (Low Pressure Chemical Vapor Deposition) method, the ALD (Atomic Layer Deposition) method, or the like. The deposition temperature when the LPCVD method is used can be set at, for example, about 200 to 500° C. The hafnium oxide film is typically a $HfO_2$ film, and the atomic ratio of Hf (hafnium) and O (oxygen) may be other than 1:2. A hafnium silicate film is an insulating material film formed of hafnium (Hf), silicon (silicon or Si), and oxygen (O), and can also be expressed as a HfSiO film, and the atomic ratio of Hf, Si, and O is not limited to 1:1:1. The film thickness (formed film thickness) of the insulation film MZ2 can be set at, for example, about 2 to 15 nm.

Then, over the insulation film MZ2, the insulation film MZ3 is formed. The insulation film MZ3 is formed of a material containing a metal (metallic element) and oxygen (O) (high dielectric constant material), is formed of preferably an aluminum oxide film, an aluminum oxynitride film, or an aluminum silicate film, and is formed of particularly preferably an aluminum oxide film, and can be formed using the LPCVD method, the ALD method, or the like. The deposition temperature when the LPCVD method is used can be set at, for example, about 200 to 500° C. The aluminum oxide film is typically an $Al_2O_3$ film, and the atomic ratio of aluminum (Al) and O (oxygen) may be other than 2:3. Further, an aluminum oxynitride film is an insulating material film formed of aluminum (Al), oxygen (O), and nitrogen (N), and can also be expressed as an AlON film, and the atomic ratio of Al, O, and N is not limited to 1:1:1. Further, the aluminum silicate film is an insulating material film including aluminum (Al), silicon (Si), and oxygen (O), and can also be expressed as an AlSiO film, and the atomic ratio of Al, Si, and O is not limited to 1:1:1. The film thickness (formed film thickness) of the insulation film MZ3 can be set at, for example, about 2 to 5 nm.

Then, over the insulation film MZ3, the insulation film MZ4 is formed. The insulation film MZ4 is formed of a different material (insulating material) from that for the insulation film MZ3. For the insulation film MZ4, a metal oxide film (metal oxide film), or the like can be used. For example, a metal oxide film formed of an oxide of one or more metals selected from the group consisting of Ti (titanium), Zr (zirconium), Y (yttrium), La (lanthanum), Pr (praseodymium), and Lu (lutetium) can be preferably used as the insulation film MZ4. A metal silicate film or a metal oxynitride film (oxynitride metal film) can also be used as the insulation film MZ4. The insulation film MZ4 can be formed using the LPCVD method, the ALD method, or the like. The deposition temperature can be set at, for example, about 200 to 500° C. The film thickness (formed film thickness) of the insulation film MZ4 can be set at, for example, about 1 to 2 nm.

Alternatively, as the insulation film MZ4, a silicon oxide film, a silicon oxynitride film, or a silicon nitride film can be used. In that case, using the LPCVD method, the ALD method, or the like, the insulation film MZ4 can be formed. The deposition temperature can be set at, for example, about 500 to 800° C. Whereas, when a silicon oxide film is used as the insulation film MZ4, the silicon oxide film can be formed by the CVD method or the ALD method. However, other than this procedure, the silicon oxide film can be formed in the following manner: for example, a silicon nitride film is formed, then, the silicon nitride film is oxidized by an oxidation treatment such as ISSG oxidation. Alternatively, the silicon oxide film can also be formed in the following manner: a polysilicon film is formed, then, the polysilicon film is oxidized by an oxidation treatment.

Then, over the insulation film MZ4, the insulation film MZ5 is formed. The insulation film MZ5 is formed of the same material (high dielectric constant material) as that for the insulation film MZ3, and can be formed in the same manner as with the insulation film MZ3. For this reason, when the insulation film MZ3 is formed of an aluminum oxide film, the insulation film MZ5 is also formed of an aluminum oxide film. When the insulation film MZ3 is formed of an aluminum oxynitride film, the insulation film MZ5 is also formed of an aluminum oxynitride film. When the insulation film MZ3 is formed of an aluminum silicate film, the insulation film MZ5 is also formed of an aluminum silicate film. The film thickness (formed film thickness) of the insulation film MZ5 can be set at, for example, about 2 to 5 nm.

In this manner, Step S3 is performed. In the memory element formation region, over the semiconductor substrate SB (p type well PW1), the insulation films MZ1, MZ2, MZ3, MZ4, and MZ5 are stacked sequentially from the bottom.

Then, a heat treatment (annealing treatment) is performed (Step S4 of FIG. 3). The heat treatment of Step S4 is performed for crystallization of the insulation films MZ3 and MZ5 forming the insulation film MZ. That is, Step S4 is a heat treatment for crystallization, and can also be regarded as a crystallization annealing treatment. The heat treatment of Step S4 can crystallize the insulation films MZ3 and MZ5. Each of the insulation films MZ3 and MZ5 is entirely polycrystallized, resulting in a polycrystal film. The heat treatment of Step S4 may crystallize not only the insulation films MZ3 and MZ5, but also the insulation film MZ2. Further, according to the material for the insulation film MZ4, the heat treatment of Step S4 also crystallizes the insulation film MZ4. The heat treatment temperature of the heat treatment of Step S4 can be set at, for example, about 800 to 1050° C. The heat treatment time can be set at, for example, several seconds (about 5 seconds). Furthermore, in Step S4, the semiconductor substrate SB is subjected to a heat treatment. As the heat treatment device, for example, a lamp annealing device can be used.

When the insulation films MZ3 and MZ5 are each an aluminum oxide film, the crystal phase (crystal structure) of the aluminum oxide film (insulation films MZ3 and MZ5) polycrystallized by crystallization annealing (Step S4) is generally α-$Al_2O_3$ of a hexagonal system, but may be γ-$Al_2O_3$ or θ-$Al_2O_3$ of another crystal phase such as a cubic system or a monoclinic system.

Figure 7:
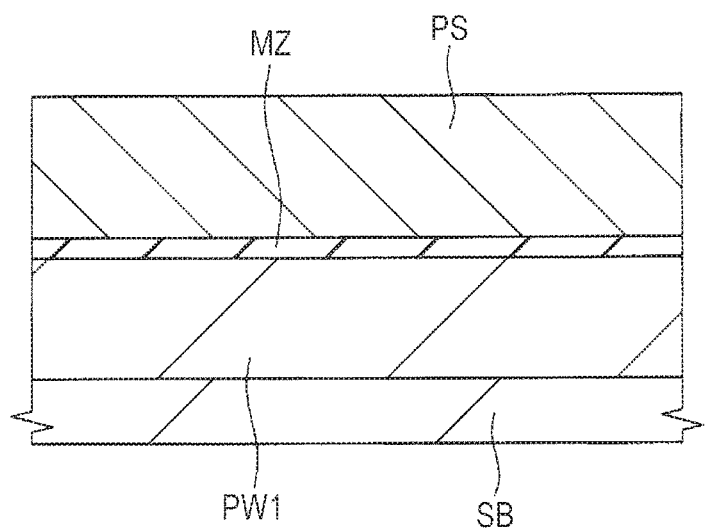
FIG. 7 is an essential part cross sectional view of the semiconductor device during a manufacturing step following FIG. 6.

Then, as shown in FIG. 7, over the main surface (entire main surface) of the semiconductor substrate SB, namely, over the insulation film MZ, a silicon film PS is formed as a conductive film for forming the gate electrode MG1 (Step S5 of FIG. 3).

The silicon film PS is formed of a polycrystal silicon film, and can be formed using the LPCVD method, or the like. The deposition temperature at that step can be set at, for example, about 600° C., and as the depositing gas (source gas), for example, a silane ($SiH_4$) gas can be used. The film thickness of the silicon film PS can be set at preferably 30 to 200 nm, for example, about 100 nm. The following is also acceptable: for deposition, after forming the silicon film PS as an amorphous silicon film, the amorphous silicon film is converted into a polycrystal silicon film by the subsequent heat treatment. The silicon film PS can be formed as a doped polysilicon film doped with an n type impurity, and, as another aspect, can also be formed as a doped polysilicon film doped with a p type impurity or a nondoped polysilicon film intentionally not doped with an impurity. When the silicon film PS is doped with an n type or p type impurity, during deposition or after deposition of the silicon film PS, an n type or p type impurity can be doped.

Figure 8:
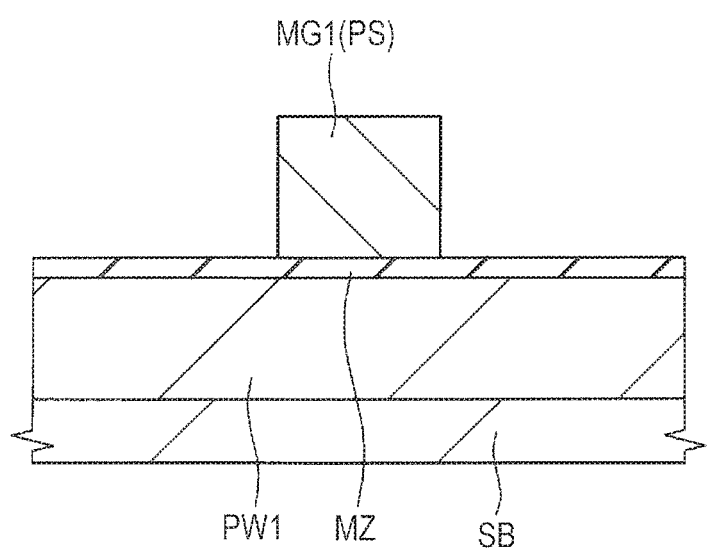
FIG. 8 is an essential part cross sectional view of the semiconductor device during a manufacturing step following FIG. 7.

Then, as shown in FIG. 8, the silicon film PS is patterned using a photolithography technology and an etching technology, thereby to form the gate electrode MG1 (Step S6 of FIG. 3). The patterning step of Step S6 can be performed, for example, in the following manner.

That is, first, over the silicon film PS, a photoresist pattern (not shown) is formed using a photolithography method. The photoresist pattern is formed in the gate electrode MG1 forming region in the memory element formation region. Then, using the photoresist pattern as an etching mask, the silicon film PS is etched (preferably, dry etched), and patterned. Thereafter, the photoresist pattern is removed. FIG. 8 shows this state.

In this manner, in Step S6, the silicon film PS is patterned, thereby to form the gate electrode MG1 formed of the patterned silicon film PS as shown in FIG. 8. In other words, in the memory element formation region, the portions of the silicon film PS except for the portion to be the gate electrode MG1 are etched and removed, thereby to form the gate electrode MG1. The gate electrode MG1 is formed over the insulation film MZ. That is, the gate electrode MG1 formed of the patterned silicon film PS is formed over the surface of the p type well PW1 via the insulation film MZ.

Figure 9:
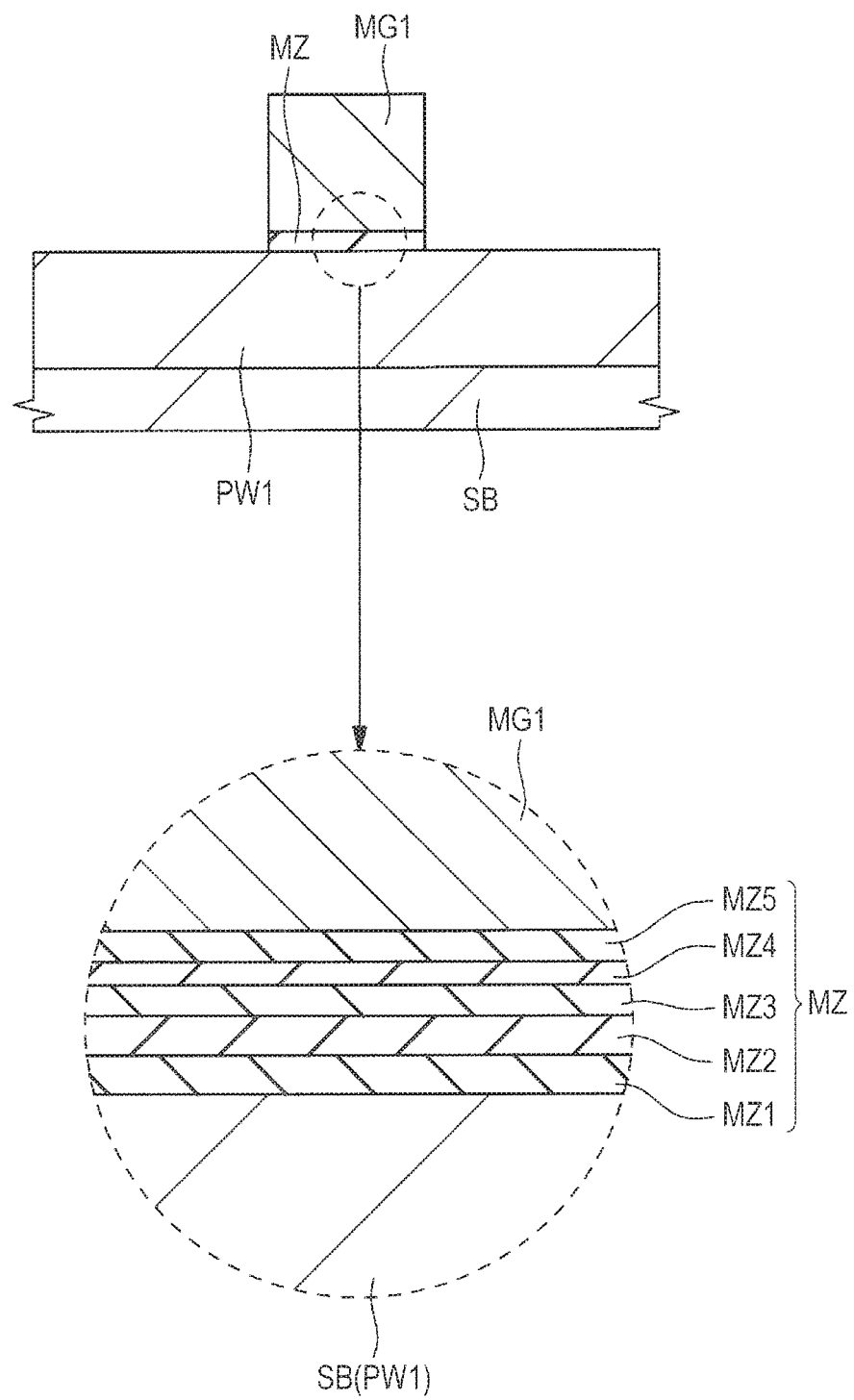
FIG. 9 is an essential part cross sectional view of the semiconductor device during a manufacturing step following FIG. 8.

Then, as shown in FIG. 9, the portions of the insulation film MZ not covered with the gate electrode MG1, and exposed are removed by etching (Step S7 of FIG. 3). In the Step S7, preferably, wet etching can be used. As an etchant, for example, a hydrofluoric acid solution, or the like can be used.

In Step S7, the insulation film MZ situated under the gate electrode MG1 is not removed, and is left, to be the gate insulation film (the gate insulation film having a charge accumulation part) of the memory element MC1. In other words, the insulation film MZ left under the gate electrode MG1, and interposed between the gate electrode MG1 and the semiconductor substrate SB (p type well PW1) in Step S7 becomes the gate insulation film of the memory element MC1.

Further, by dry etching for patterning the silicon film PS in Step S6, the portion of the insulation film MZ not covered with the gate electrode MG1 may be partially etched. That is, dry etching for patterning the silicon film PS in Step S6, and etching (preferably, wet etching) of Step S7 may remove the portions of the insulation film MZ not covered with the gate electrode MG1.

Incidentally, for ease of understanding of the drawing, also in FIG. 9, the insulation film MZ formed of the lamination film of the insulation films MZ1, MZ2, MZ3, MZ4, and MZ5 is simply shown as the insulation film MZ. However, actually, as shown in the enlarged view of the region surrounded by a dotted line in FIG. 9, the insulation film MZ is formed of the lamination film of the insulation films MZ1, MZ2, MZ3, MZ4, and MZ5.

Figure 10:
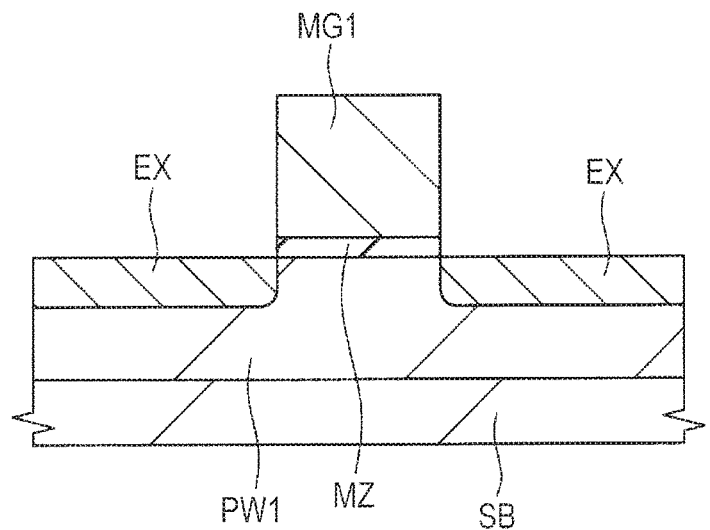
FIG. 10 is an essential part cross sectional view of the semiconductor device during a manufacturing step following FIG. 9.

Then, as shown in FIG. 10, by an ion implantation method, or the like, in the semiconductor substrate SB (p type well PW1) in the memory element formation region, $n^-$ type semiconductor regions EX are formed (Step S8 of FIG. 3).

That is, in Step S8, into the regions on the opposite sides (opposite sides in the gate length direction) of the gate electrode MG1 at the semiconductor substrate SB (p type well PW1) in the memory element formation region, an n type impurity such as phosphorus (P) or arsenic (As) is ion implanted, thereby to form the $n^-$ type semiconductor regions EX. In ion implantation for forming the n type semiconductor regions EX, the gate electrode MG1 can function as a mask (ion implantation inhibiting mask). For this reason, the $n^-$ type semiconductor regions EX are formed in self-alignment with the sidewalls of the gate electrode MG1.

Figure 11:
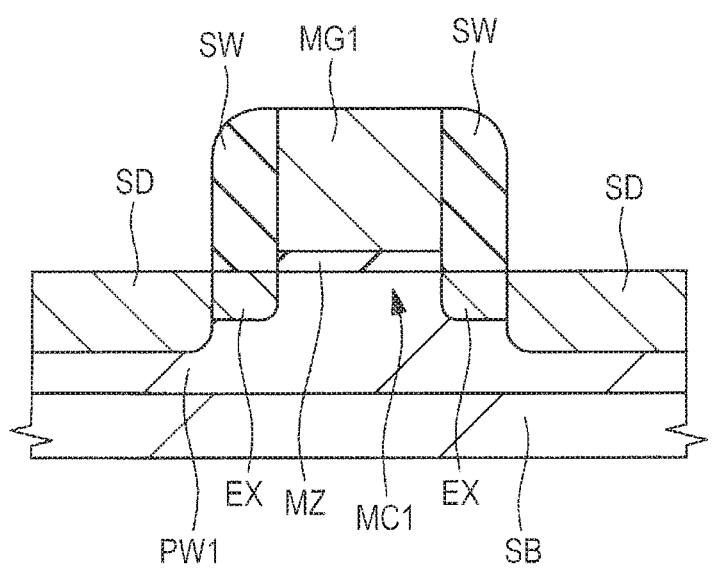
FIG. 11 is an essential part cross sectional view of the semiconductor device during a manufacturing step following FIG. 10.

Then, as shown in FIG. 11, over each sidewall of the gate electrode MG1, a sidewall spacer SW formed of an insulation film is formed as the sidewall insulation film (Step S9 of FIG. 3).

The sidewall spacer SW formation step of Step S9 can be performed, for example, in the following manner. That is, entirely over the main surface of the semiconductor substrate SB, an insulation film for forming the sidewall spacer SW is formed in such a manner as to cover the gate electrode MG1. The insulation film is formed of, for example, a silicon oxide film or a silicon nitride film, or a lamination film thereof, and can be formed using a CVD method, or the like. Then, the insulation film is etched back by an anisotropic etching technology. As a result, as shown in FIG. 11, over each sidewall of the gate electrode MG1, the insulation film for forming the sidewall spacer SW is selectively left, thereby to form the sidewall spacer SW.

Then, as shown in FIG. 11, by an ion implantation method, or the like, in the semiconductor substrate SB (p type well PW1) in the memory element formation region, $n^+$ type semiconductor regions SD are formed (Step S10 of FIG. 3).

That is, in Step S10, into the regions on the opposite sides (opposite sides in the gate length direction) of the gate electrode MG1 and the sidewall spacer SW in the semiconductor substrate SB (p type well PW1) in the memory element formation region, an n type impurity such as phosphorus (P) or arsenic (As) is ion implanted, thereby to form the $n^+$ type semiconductor regions SD. In the ion implantation, the gate electrode MG1 and the sidewall spacers SW over the sidewalls thereof can function as a mask (ion implantation inhibiting mask). For this reason, the $n^+$ type semiconductor regions SD are formed in self-alignment with the side surfaces of the sidewall spacers SW over the sidewalls of the gate electrode MG1. The $n^+$ type semiconductor region SD is higher in impurity density, and larger in junction depth than the $n^-$ type semiconductor region EX.

In this manner, the $n^-$ type semiconductor regions EX, and the $n^+$ type semiconductor regions SD having a higher impurity density than that form n type semiconductor regions functioning as the semiconductor regions (source/drain regions) for source or drain of the memory element MC1 in the semiconductor substrate SB (p type well PW1) in the memory element formation region.

Then, activating annealing of a heat treatment for activating the impurity doped into the semiconductor regions (the $n^-$ type semiconductor regions EX and the $n^+$ type semiconductor regions SD) for source or drain is performed (Step S11 of FIG. 3). The heat treatment of Step S11 can be performed, for example, at a heat treatment of 900° C. to 1100° C., in an inactive gas atmosphere, and more preferably in a nitrogen atmosphere.

In this manner, the memory element MC1 is formed. The gate electrode MG1 functions as the gate electrode of the memory element MC1, and the insulation film MZ under the gate electrode MG1 functions as the gate insulation film of the memory element MC1. Then, the n type semiconductor region functioning as the source or drain of the memory element MC1 is formed of the $n^+$ type semiconductor region SD and the $n^-$ type semiconductor region EX.

Then, by the salicide technology, a metal silicide layer SL is formed. The metal silicide layer SL can be formed in the following manner.

Figure 12:
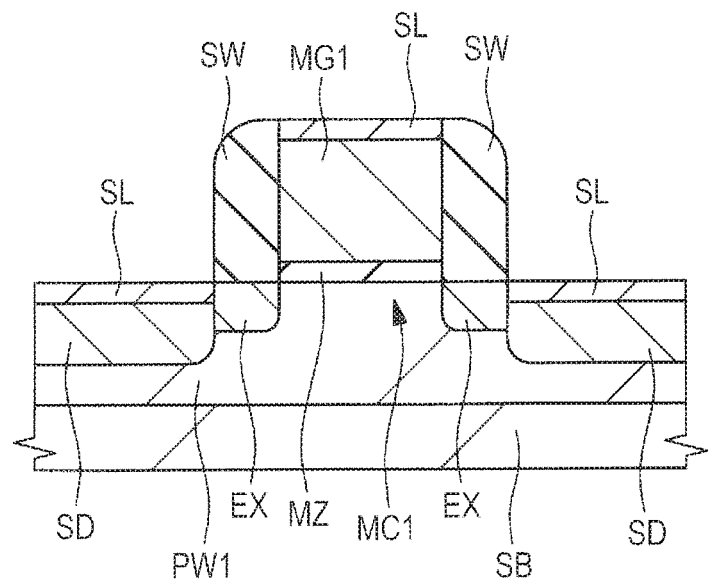
FIG. 12 is an essential part cross sectional view of the semiconductor device during a manufacturing step following FIG. 11.

That is, first, entirely over the main surface of the semiconductor substrate SB including over each upper surface of the $n^+$ type semiconductor regions SD and the gate electrode MG1, a metal film (not shown) is formed in such a manner as to cover the gate electrode MG1 and the sidewall spacers SW. The metal film is formed of, for example, a cobalt film, a nickel film, or a nickel platinum alloy film, and can be formed using a sputtering method, or the like. Then, the semiconductor substrate SB is subjected to a heat treatment, thereby to allow each upper layer portion of the $n^+$ type semiconductor regions SD and the gate electrode MG1 to react with the metal film. As a result, as shown in FIG. 12, the metal silicide layer SL of the reactant layer of silicon and the metal is formed at each top of the $n^+$ type semiconductor regions SD and the gate electrode MG1. Thereafter, the unreacted portions of the metal film are removed by wet etching, or the like. FIG. 12 shows the cross sectional view at this stage.

Figure 13:
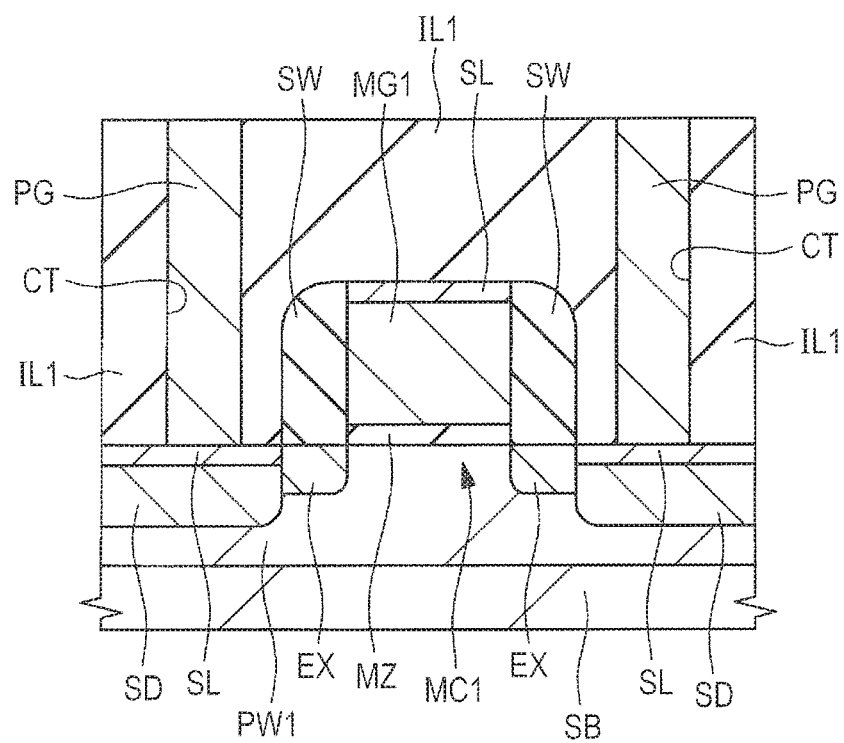
FIG. 13 is an essential part cross sectional view of the semiconductor device during a manufacturing step following FIG. 12.

Then, as shown in FIG. 13, entirely over the main surface of the semiconductor substrate SB, an insulation film IL1 is formed as an interlayer insulation film in such a manner as to cover the gate electrode MG1 and the sidewall spacers SW.

The insulation film IL1 is formed of a simple substance film of a silicon oxide film, or a lamination film of a silicon nitride film, and a silicon oxide film formed over the silicon nitride film, and thicker than the silicon nitride film, and can be formed using, for example, a CVD method. After forming the insulation film IL1, if required, the upper surface of the insulation film IL1 is planarized using a CMP (Chemical Mechanical Polishing) method, or the like.

Then, using the photoresist pattern (not shown) formed over the insulation film IL1 using a photolithography method as an etching mask, the insulation film IL1 is dry etched, thereby to form contact holes CT in the insulation film IL1.

Then, a conductive plug PG is formed in each contact hole CT.

For forming the plug PG, for example, over the insulation film IL1 including the inside (over the bottom and the sidewall) of the contact hole CT, a barrier conductor film is formed. The barrier conductor film is formed of, for example, a titanium film, a titanium nitride film, or a lamination film thereof. Then, over the barrier conductor film, a main conductor film formed of a tungsten film, or the like is formed in such a manner as to fill the contact hole CT.

Then, the unnecessary portions of the main conductor film and the barrier conductor film over the insulation film IL1 are removed by a CMP method, an etch back method, or the like. As a result, the plug PG can be formed.

Figure 14:
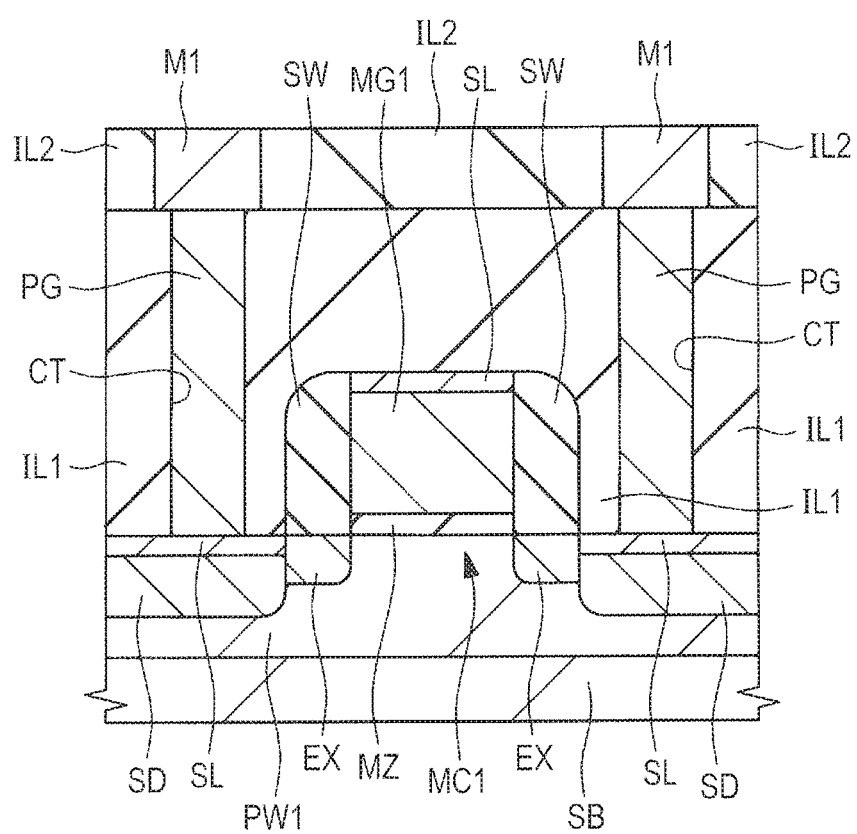
FIG. 14 is an essential part cross sectional view of the semiconductor device during a manufacturing step following FIG. 13.

Then, over the insulation film IL1 including the plug PG buried therein, a wire (wiring layer) M1 of a first-layer wire is formed. For example, as shown in FIG. 14, over the insulation film IL1 including the plug PG buried therein, the insulation film IL2 is formed. Then, a wiring trench is formed in a prescribed region of the insulation film IL2. Thereafter, the wire M1 is buried in the wiring trench using a single damascene technology. As a result, the wire M1 can be formed.

Then, by a dual damascene method, or the like, second- or higher-layer wires are formed, but are herein not shown and not described. Further, the wire M1 and higher-layer wires are not limited to damascene wires, can also be formed by patterning a wiring conductor film, and can be formed as, for example, a tungsten wire or an aluminum wire.

In the manner described up to this point, the semiconductor device of the present embodiment is manufactured.

<Split Gate Type Memory Element>

In the column of "single gate type memory element", a description has been given to the case where the present embodiment is applied to a single gate type memory element. Herein, a description will be given to the case where the present embodiment is applied to a split gate type memory element.

Figure 15:
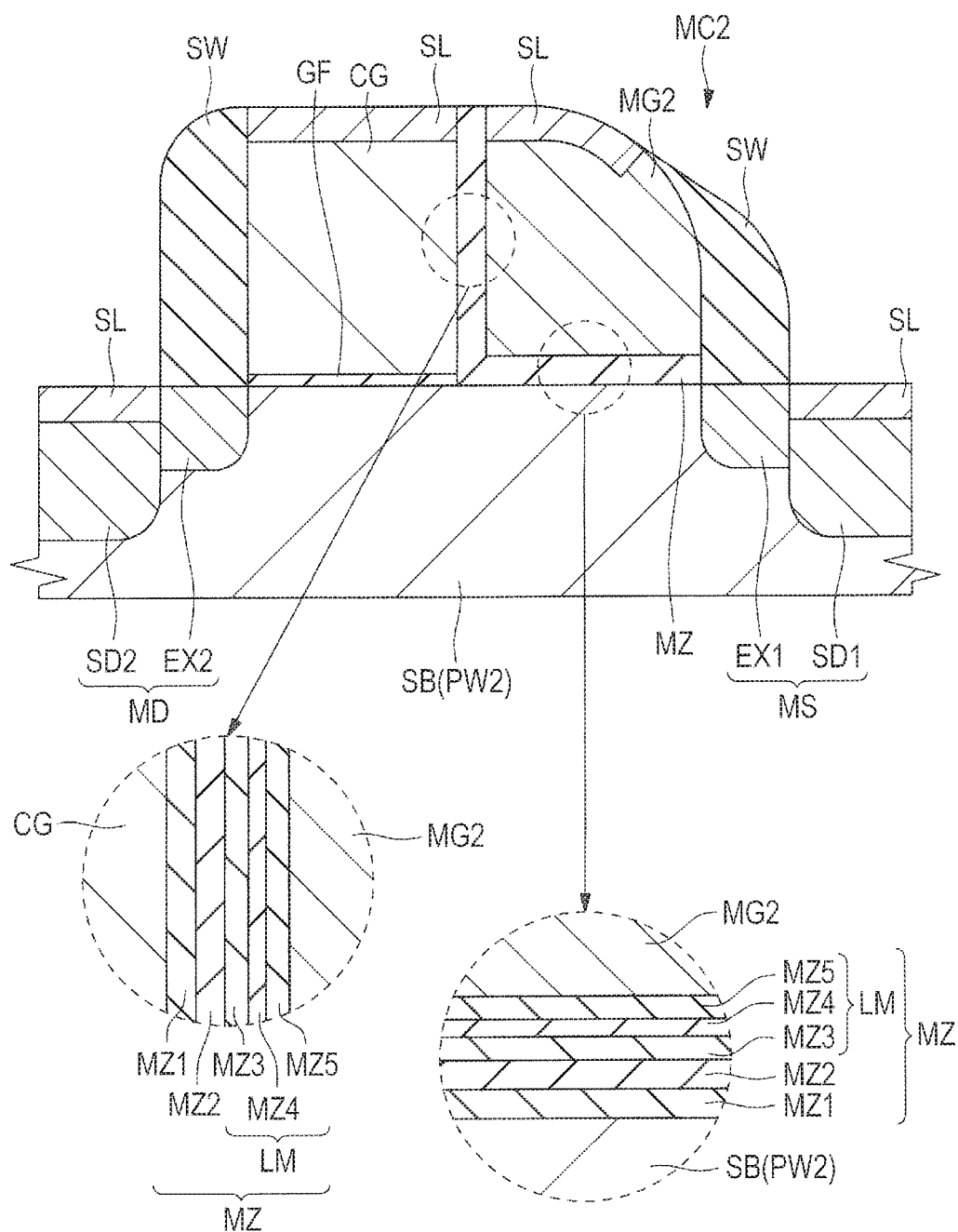
FIG. 15 is an essential part cross sectional view of a semiconductor device of one embodiment.
Figures 16, 17:
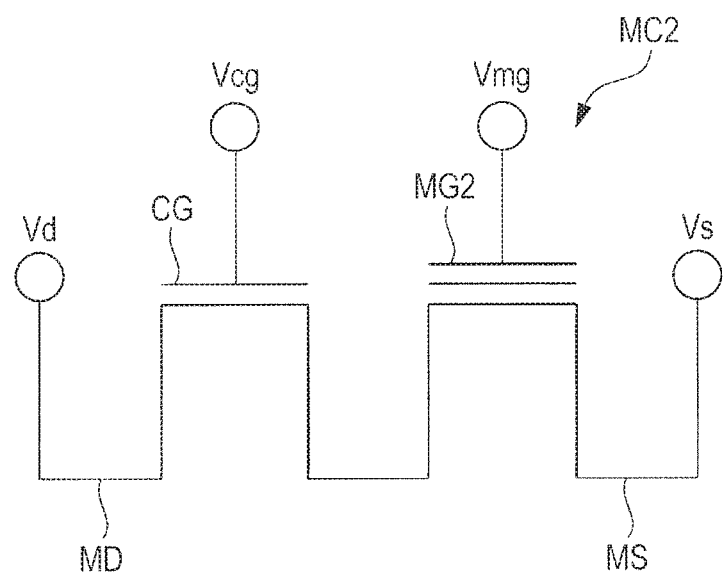
FIG. 16 is an equivalent circuit diagram of the memory cell.
FIG. 17 is a table showing one example of the application conditions of voltages to respective sites of a selection memory cell at the times of "write", "erase", and "read"

FIG. 15 is an essential part cross sectional view of the semiconductor device of the present embodiment, and shows an essential part cross sectional view of the memory cell region of a nonvolatile memory. FIG. 16 is an equivalent circuit diagram of the memory element MC2. Incidentally, in FIG. 15, the insulation films IL1 and IL2, the contact holes CT, the plugs PG, and the wire M1 are not shown.

As shown in FIG. 15, at the semiconductor substrate SB, the memory element (storage element or memory cell) MC2 of a nonvolatile memory formed of a memory transistor and a control transistor is formed. Actually, at the semiconductor substrate SB, a plurality of memory elements MC2 are formed in an array.

As shown in FIGS. 15 and 16, the memory element MC2 of a nonvolatile memory is a split gate type memory element, and includes two MISFETs of a control transistor having a control gate electrode CG and a memory transistor having a memory gate electrode MG2, coupled with each other.

Herein, the MISFET having a gate insulation film including a charge accumulation part and the memory gate electrode MG2 is referred to as a memory transistor. Whereas, the MISFET having a gate insulation film and the control gate electrode CG is referred to as a control transistor. Incidentally, the control transistor is a memory cell selecting transistor, and hence can also be regarded as a selection transistor.

Below, the configuration of the memory element MC2 will be specifically described.

As shown in FIG. 15, the memory element MC2 of a nonvolatile memory has n type semiconductor regions MS and MD for source and drain formed in the p type well PW2 of the semiconductor substrate SB, the control gate electrode CG formed over the semiconductor substrate SB (p type well PW2), and the memory gate electrode MG2 formed over the semiconductor substrate SB (p type well PW2), and adjacent to the control gate electrode CG. Then, the memory element MC2 of a nonvolatile memory further has an insulation film GF formed between the control gate electrode CG and the semiconductor substrate SB (p type well PW2), and an insulation film MZ formed between the memory gate electrode MG2 and the semiconductor substrate SB (p type well PW2), and between the memory gate electrode MG2 and the control gate electrode CG.

The control gate electrode CG and the memory gate electrode MG2 extend, and are arranged side by side along the main surface of the semiconductor substrate SB with the insulation film MZ interposed between the opposing side surfaces thereof. The control gate electrode CG and the memory gate electrode MG2 are formed over the semiconductor substrate SB (p type well PW2) between the semiconductor region MD and the semiconductor region MS via the insulation film GF or the insulation film MZ. The memory gate electrode MG2 is situated on the semiconductor region MS side, and the control gate electrode CG is situated on the semiconductor region MD side. However, the control gate electrode CG is formed via the insulation film GF, and the memory gate electrode MG2 is formed via the insulation film MZ over the semiconductor substrate SB. The control gate electrode CG and the memory gate electrode MG2 are adjacent to each other with the insulation film MZ interposed therebetween.

The insulation film GF formed between the control gate electrode CG and the semiconductor substrate SB (p type well PW2), namely, the insulation film GF under the control gate electrode CG functions as the gate insulation film of the control transistor. The insulation film GF is formed of, for example, a silicon oxide film or a silicon oxynitride film.

In the memory element MC1 of FIGS. 1 and 2, the insulation film MZ is formed between the gate electrode MG1 and the semiconductor substrate SB (p type well PW1). However, in the memory element MC2 of FIG. 15, the insulation film MZ extends across both regions of the region between the memory gate electrode MG2 and the semiconductor substrate SB (p type well PW2), and the region between the memory gate electrode MG2 and the control gate electrode CG.

The configuration (lamination configuration) of the insulation film MZ is equal between the case of the memory element MC2 shown in FIG. 15 and the case of the memory element MC1 of FIGS. 1 and 2, and hence, herein, a repeated description thereon is omitted. Therefore, as with the case of the memory element MC1 of FIGS. 1 and 2, also in the case of the memory element MC2 shown in FIG. 15, the insulation film MZ is formed of a lamination film of an insulation film MZ1, an insulation film MZ2 formed over the insulation film MZ1, an insulation film MZ3 formed over the insulation film MZ2, an insulation film MZ4 formed over the insulation film MZ3, and an insulation film MZ5 formed over the insulation film MZ4. The insulation film MZ5 is adjacent to the memory gate electrode MG2.

The insulation film MZ between the memory gate electrode MG2 and the semiconductor substrate SB (p type well PW2), namely, the insulation film MZ under the memory gate electrode MG2 functions as the gate insulation film (the gate insulation film having a charge accumulation part in the inside thereof) of the memory transistor. The insulation film MZ can be regarded as an insulation film having a charge accumulation part (herein, the insulation film MZ2) in the inside thereof. Incidentally, the insulation film MZ between the memory gate electrode MG2 and the semiconductor substrate SB (p type well PW2) functions as the gate insulation film of the memory transistor. However, the insulation film MZ between the memory gate electrode MG2 and the control gate electrode CG functions as the insulation film for establishing an insulation (electric isolation) between the memory gate electrode MG2 and the control gate electrode CG.

Incidentally, for ease of understanding of the drawing, in FIG. 15, the insulation film MZ formed of a lamination film of the insulation films MZ1, MZ2, MZ3, MZ4, and MZ5 is simply shown as the insulation film MZ. However, actually, as shown in the enlarged view of the region surrounded by a dotted line circle in FIG. 15, the insulation film MZ is formed of a lamination film of the insulation films MZ1, MZ2, MZ3, MZ4, and MZ5.

The control gate electrode CG is formed of a conductive film, and is formed of a silicon film such as an n type polysilicon film (doped polysilicon film doped with an n type impurity). Specifically, the control gate electrode CG is formed of a patterned silicon film.

The memory gate electrode MG2 is formed of a conductive film, and is formed of a silicon film such as an n type polysilicon film. The silicon film forming the memory gate electrode MG2 can be formed as a doped polysilicon film doped with an n type impurity. As another aspect, the silicon film can be formed as a doped polysilicon film doped with a p type impurity, or a nondoped polysilicon film not intentionally doped with an impurity. The memory gate electrode MG2 is formed in a sidewall spacer shape over one sidewall of the control gate electrode CG via the insulation film MZ.

Each of the semiconductor region MS and the semiconductor region MD is a semiconductor region for source or drain. That is, the semiconductor region MS is a semiconductor region functioning as one of the source region or the drain region, and the semiconductor region MD is a semiconductor region functioning as the other of the source region or the drain region. Herein, the semiconductor region MS is a semiconductor region functioning as the source region, and the semiconductor region MD is a semiconductor region functioning as the drain region. The semiconductor regions MS and MD are each formed of a semiconductor region doped with an n type impurity, and each have a LDD structure. That is, the semiconductor region MS for source has an $n^-$ type semiconductor region EX1 (extension region), and an $n^+$ type semiconductor region SD1 (source region) having a higher impurity density than that of the n-type semiconductor region EX1. Whereas, the semiconductor region MD for drain has an $n^-$ type semiconductor region EX2 (extension region), and an $n^+$ type semiconductor region SD2 (drain region) having a higher impurity density than that of the $n^-$ type semiconductor region EX2.

The semiconductor region MS is formed at the semiconductor substrate SB at a position adjacent to the memory gate electrode MG2 in the gate length direction (the gate length direction of the memory gate electrode MG2). Whereas, the semiconductor region MD is formed at the semiconductor substrate SB at a position adjacent to the control gate electrode CG in the gate length direction (the gate length direction of the control gate electrode CG).

Over the sidewalls of the memory gate electrode MG2 and the control gate electrode CG on the sides thereof not adjacent to each other, sidewall spacers SW are formed as sidewall insulation films, respectively.

The low-density $n^-$ type semiconductor region EX1 is formed under the sidewall spacer SW over the sidewall of the memory gate electrode MG2, in such a manner as to be adjacent to the channel region of the memory transistor. The high-density $n^+$ type semiconductor region SD1 is formed in such a manner as to be adjacent to the low-density $n^-$ type semiconductor region EX1, and to be separated from the channel region of the memory transistor by the $n^-$ type semiconductor region EX1. The low-density $n^-$ type semiconductor region EX2 is formed under the sidewall spacer SW over the sidewall of the control gate electrode CG, in such a manner as to be adjacent to the channel region of the control transistor. The high-density $n^+$ type semiconductor region SD2 is formed in such a manner as to be adjacent to the low-density $n^-$ type semiconductor region EX2, and to be separated from the channel region of the control transistor by the $n^-$ type semiconductor region EX2. The channel region of the memory transistor is formed under the insulation film MZ under the memory gate electrode MG2, and the channel region of the control transistor is formed under the insulation film GF under the control gate electrode CG.

At each top of the $n^+$ type semiconductor regions SD1 and SD2, the memory gate electrode MG2, and the control gate electrode CG, a metal silicide layer SL is formed by a salicide technology, or the like. The formation of the metal silicide layer SL can be omitted, if not required.

Figure 30:
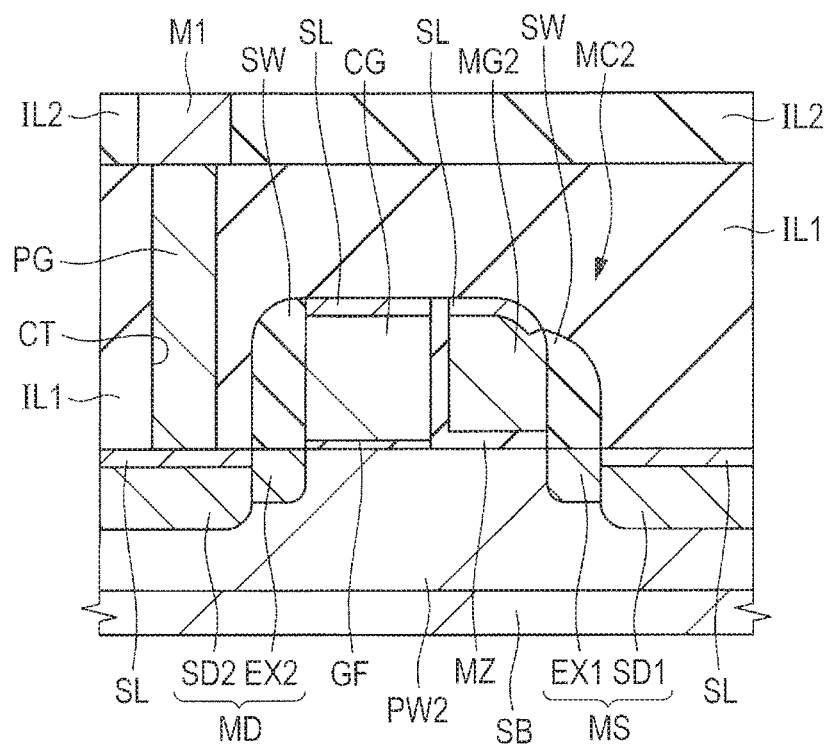
FIG. 30 is an essential part cross sectional view of the semiconductor device during a manufacturing step following FIG. 29.

Further, although not shown in FIG. 15, as shown in FIG. 30 described later, over the semiconductor substrate SB, the insulation film IL1 is formed as an interlayer insulation film in such a manner as to cover the control gate electrode CG, the memory gate electrode MG2, and the sidewall spacers SW. Then, in the insulation film IL1, contact holes CT are formed, and a plug PG is buried in each contact hole CT. Over the insulation film IL1 including the plug PG buried therein, an insulation film IL2 and a wire M1 are formed.

Then, the operation example of the nonvolatile memory element MC2 will be described by reference to FIG. 17.

FIG. 17 is a table showing one example of the application conditions of voltages to respective sites of a selection memory cell at the times of "write", "erase", and "read". The table of FIG. 17 shows the voltages (Vd, Vcg, Vmg, Vs, and Vb) to be applied to respective sites of the memory cell (selection memory cell) as shown in FIGS. 15 and 16 at the respective times of "write", "erase", and "read". Herein, the voltage Vmg is the voltage to be applied to the memory gate electrode MG2. Whereas, the voltage Vs is the voltage to be applied to the semiconductor region MS (source region). Further, the voltage Vcg is the voltage to be applied to the control gate electrode CG. Furthermore, the voltage Vd is the voltage to be applied to the semiconductor region MD (drain region). Still further, the base voltage Vb is the base voltage to be applied to the p type well PW2. Incidentally, those shown in the table of FIG. 17 are preferable examples of the application conditions of the voltage, and are not exclusive, and may be variously changed, if required. Further, in the present embodiment, injection of electrons into the charge accumulation part (herein, the insulation film MZ2) in the insulation film MZ of the memory transistor is defined as "write", and injection of holes is defined as "erase".

For the write method, the write method (hot electron injection write method) for performing write with hot electron injection by source side injection, referred to as a so-called SSI (Source Side Injection) method can be preferably used.

With write of the SSI method, for example, the voltages as shown in the section of "write" of FIG. 17 are applied to respective sites of the selection memory cell to perform write. Thus, electrons are injected into the charge accumulation layer (herein, the insulation film MZ2) in the insulation film MZ of the selection memory cell, thereby to perform write. At this step, hot electrons are generated in the channel region (between source and drain) under between the two gate electrodes (the memory gate electrode MG2 and the control gate electrode CG). Thus, hot electrons are injected into the charge accumulation layer (herein, the insulation film MZ2) in the insulation film MZ under the memory gate electrode MG2. For this reason, with the SSI method, electrons are injected into the control gate electrode CG side of the insulation film MZ. The injected hot electrons (electrons) are trapped by the trap level of the charge accumulation layer (herein, the insulation film MZ2) in the insulation film MZ. As a result, the threshold voltage of the memory transistor increases. That is, the memory transistor is put into the write state.

For the erase method, the erase method (tunneling erase method) for performing erase by FN (Fowler Nordheim) tunneling, referred to as a so-called FN method can be preferably used.

With erase of the FN method, for example, the voltages (Vmg is a positive voltage, and Vd, Vcg, Vs, and Vb are each zero volt) as shown in the section of "erase" of FIG. 17 are applied to respective sites of the selection memory cell to perform erase. Thus, in the selection memory cell, holes are tunneled from the memory gate electrode MG2, and are injected into the charge accumulation layer (herein, the insulation film MZ2) in the insulation film MZ, thereby to perform erase. At this step, holes are injected from the memory gate electrode MG2 into the insulation film MZ tunneling through the insulation films MZ5, MZ4, and MZ3 by the FN tunneling effect, and are trapped by the trap level of the charge accumulation layer (herein, the insulation film MZ2) in the insulation film MZ. As a result, the memory transistor is decreased in threshold voltage (is put into the erase state).

For read, for example, the voltages as shown in the section of "read" of FIG. 17 are applied to respective sites of the selection memory cell to perform read. The voltage Vmg to be applied to the memory gate electrode MG2 at the time of read is set at a value between the threshold voltage of the memory transistor in the write state and the threshold voltage of the memory transistor in the erase state. As a result, it is possible to discriminate between the write state and the erase state.

Further, as the erase method, there is also the erase method (hot hole injection erase method) for performing erase with hot hole injection by the BTBT (Band-To-Band Tunneling phenomenon) referred to as the so-called BTBT method. With erase of the BTBT method, holes generated by BTBT are injected from the semiconductor substrate (SB) side into the charge accumulation layer (herein, the insulation film MZ2) in the insulation film MZ, thereby to perform erase.

In the present embodiment, as the erase method, the BTBT method (BTBT erase method) can be used. However, the FN method (tunneling erase method) is more preferably used. The FN method requires less current consumption (power consumption) at the time of erase than the BTBT method. In the present embodiment, by using the FN method as the erase method, namely, by injecting holes from the memory gate electrode MG2 into the insulation film MZ2 of the insulation film MZ (by tunneling), erase of the selection memory cell is performed. As a result, it is possible to reduce the current consumption (power consumption) at the time of erase.

Figure 18:
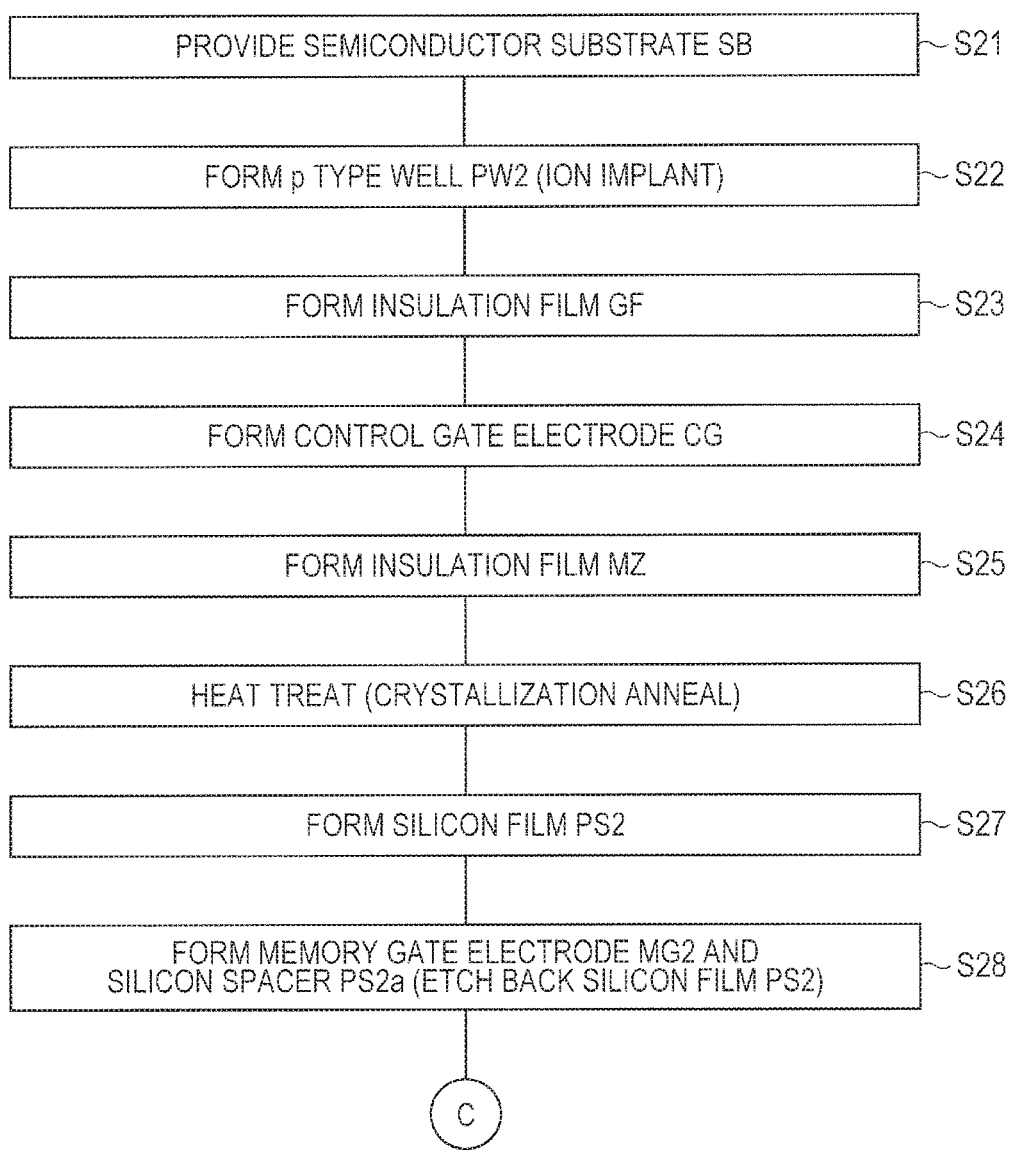
FIG. 18 is a process flowchart showing some of the manufacturing steps of the semiconductor device of one embodiment.
Figure 19:
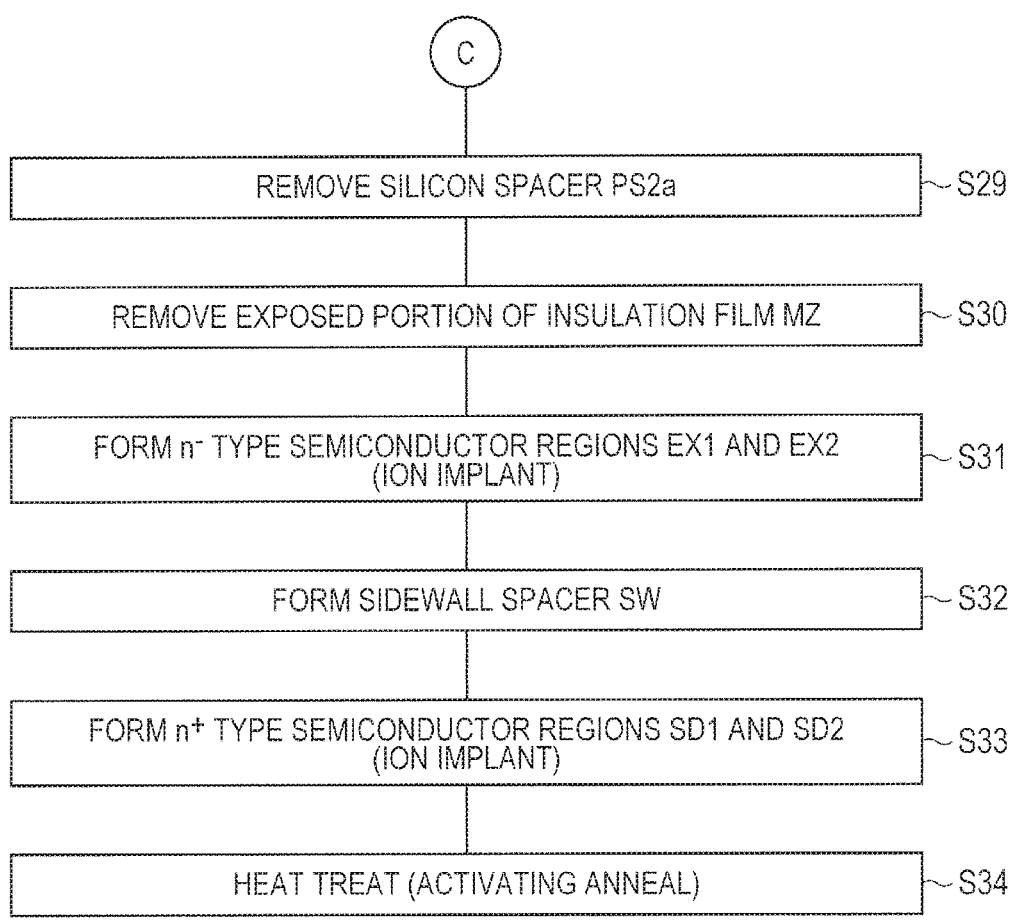
FIG. 19 is a process flowchart showing others of the manufacturing steps of the semiconductor device of one embodiment.

Then, a method for manufacturing the semiconductor device having the nonvolatile memory element MC2 shown in FIGS. 15 and 16 will be described by reference to FIGS. 18 to 30. FIGS. 18 and 19 are each a process flowchart showing some of the manufacturing steps of the semiconductor device of the present embodiment. FIGS. 20 to 30 are each an essential part cross sectional view of the semiconductor device of the present embodiment during a manufacturing step.

Figure 20:
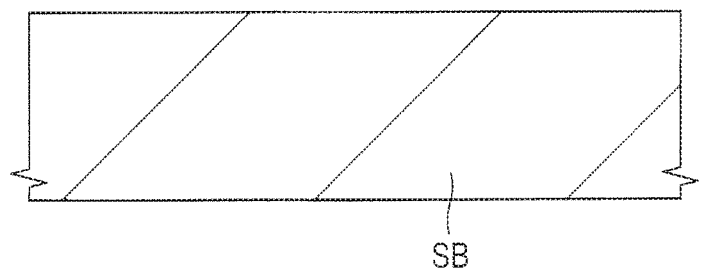
FIG. 20 is an essential part cross sectional view of the semiconductor device of one embodiment during a manufacturing step.

As shown in FIG. 20, first, the same semiconductor substrate SB as that of the case of FIG. 4 is provided (Step S21 of FIG. 18). Then, at the main surface of the semiconductor substrate SB, an element isolation region (not shown) defining an active region is formed.

Figure 21:
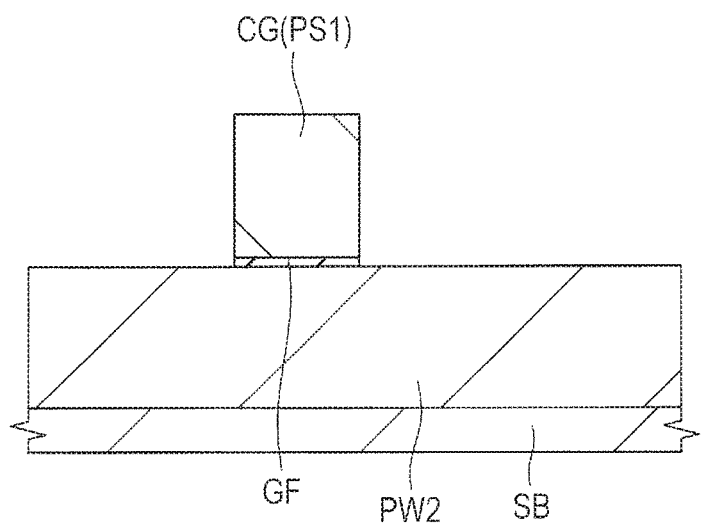
FIG. 21 is an essential part cross sectional view of the semiconductor device during a manufacturing step following FIG. 20.

Then, as shown in FIG. 21, in the semiconductor substrate SB in the memory cell formation region, a p type well PW2 is formed (Step S22 of FIG. 18). The p type well PW2 can be formed by an ion implantation method, and is formed from the main surface of the semiconductor substrate SB to a prescribed depth.

Then, by dilute hydrofluoric acid cleaning, or the like, the surface of the semiconductor substrate SB (p type well PW2) is purified. Then, at the main surface (the surface of the p type well PW2) of the semiconductor substrate SB, an insulation film GF for the gate insulation film of the control transistor is formed (Step S23 of FIG. 18). Then, over the main surface (the entire main surface) of the semiconductor substrate SB, namely, over the insulation film GF, a silicon film PS1 is formed (deposited) as a conductor film for forming the control gate electrode CG. Then, the silicon film PS1 is patterned using a photolithography method and a dry etching method. As a result, the control gate electrode CG formed of the patterned silicon film PS1 is formed. (Step S24 of FIG. 18).

The silicon film PS1 is formed of a polycrystal silicon film, and can be formed using a CVD method, or the like. The following is also acceptable: for deposition, after forming the silicon film PS1 as an amorphous silicon film, the amorphous silicon film is converted into a polycrystal silicon film by the subsequent heat treatment. The silicon film PS1 is doped with an n type impurity during deposition or after deposition.

In the memory cell formation region, the insulation film GF except for the portions thereof covered with the control gate electrode CG may be removed by performing dry etching performed in the patterning step of the silicon film PS1, or wet etching after the dry etching.

Then, a cleaning treatment is performed, thereby to subject the main surface of the semiconductor substrate SB to a purification treatment. Then, as shown in FIG. 22, entirely over the main surface of the semiconductor substrate SB, namely, over the main surface (the front surface) of the semiconductor substrate SB, and over the surface (the upper surface and the side surface) of the control gate electrode CG, the insulation film MZ for the gate insulation film of the memory transistor is formed (Step S25 of FIG. 18).

Figure 22:
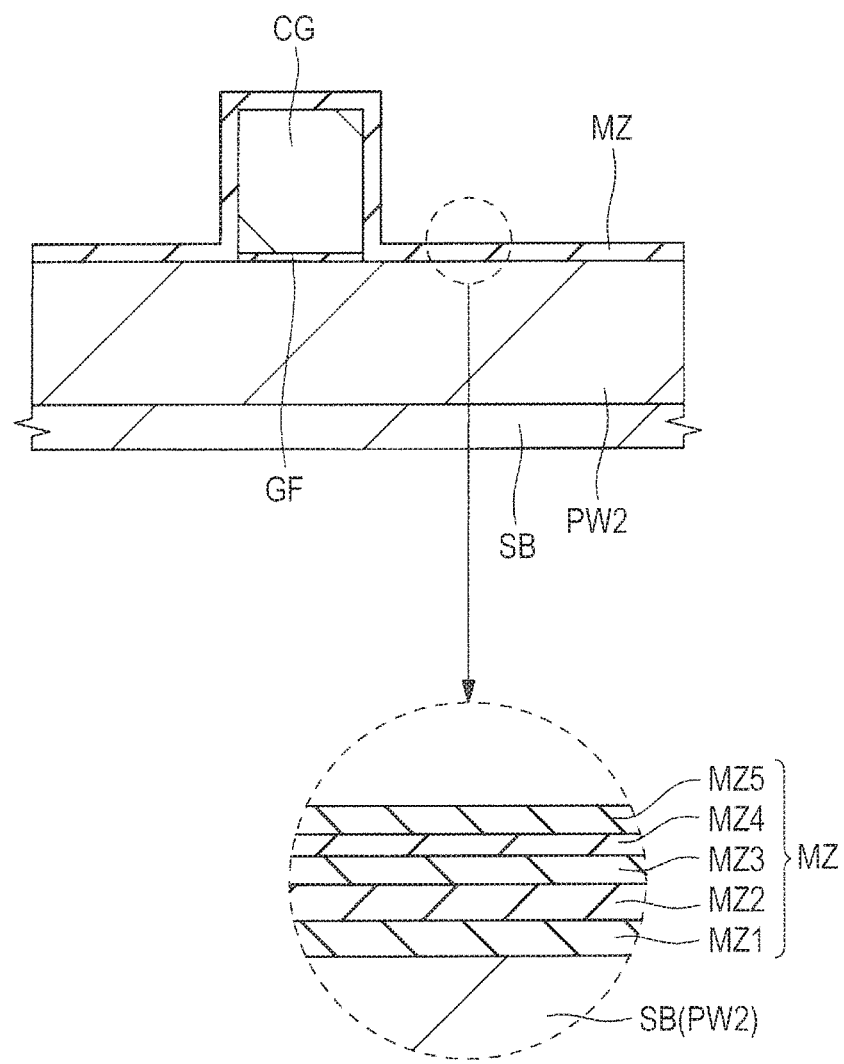
FIG. 22 is an essential part cross sectional view of the semiconductor device during a manufacturing step following FIG. 21.

Incidentally, for ease of understanding of the drawing, in FIG. 22, the insulation film MZ formed of a lamination film of the insulation films MZ1, MZ2, MZ3, MZ4, and MZ5 is simply shown as the insulation film MZ. However, actually, as shown in the enlarged view of the region surrounded by a dotted line circle in FIG. 22, the insulation film MZ is formed of a lamination film of the insulation films MZ1, MZ2, MZ3, MZ4, and MZ5.

The insulation film MZ formation step (Step S25) of FIG. 22 is basically the same as the insulation film MZ formation step (the Step S3) of FIG. 6, and hence herein, a repeated description thereon is omitted. However, the case of FIG. 22 (Step S25) is different from the case of FIG. 6 (Step S3) in that the insulation film MZ is formed not only over the main surface (front surface) of the semiconductor substrate SB, but also over the surface (the upper surface and the side surface) of the control gate electrode CG.

After forming the insulation film MZ, the same heat treatment (crystallization annealing) as the Step S4 is performed (Step S26 of FIG. 18). The heat treatment of Step S26 is performed for the same object and in the same manner as with the heat treatment of Step S4, and provides the same effects. For this reason, herein, a repeated description thereon is omitted.

Figure 23:
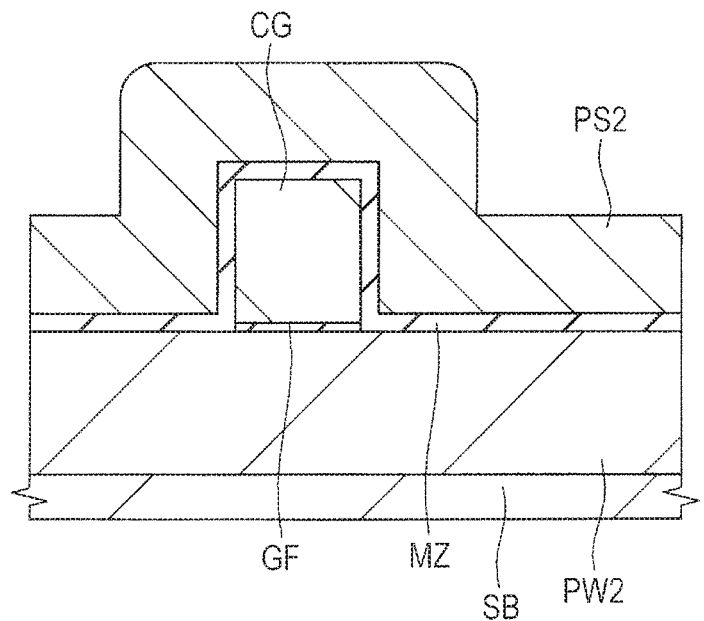
FIG. 23 is an essential part cross sectional view of the semiconductor device during a manufacturing step following FIG. 22.

Then, as shown in FIG. 23, over the main surface (the entire main surface) of the semiconductor substrate SB, namely, over the insulation film MZ, a silicon film PS2 is formed as a conductor film for forming the memory gate electrode MG2 in such a manner as to cover the control gate electrode CG (Step S27 of FIG. 18).

The silicon film PS2 is formed of a polycrystal silicon film, and can be formed using a CVD method, or the like. The following is also acceptable: for deposition, after forming the silicon film PS2 as an amorphous silicon film, the amorphous silicon film is converted into a polycrystal silicon film by the subsequent heat treatment. Alternatively, the silicon film PS2 can be formed as a doped polysilicon film doped with an n type impurity. However, as another aspect, the silicon film PS2 can be formed as a doped polysilicon film doped with a p type impurity, or a nondoped polysilicon film not intentionally doped with an impurity.

Then, by an anisotropic etching technology, the silicon film PS2 is etched back (Step S28 of FIG. 18).

Figure 24:
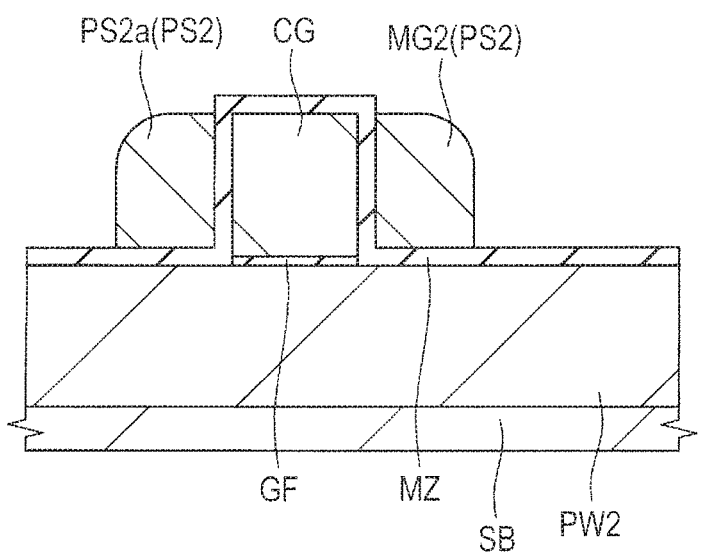
FIG. 24 is an essential part cross sectional view of the semiconductor device during a manufacturing step following FIG. 23.

In the etch back step of Step S28, the silicon film PS2 is etched back by anisotropic etching by the deposited film thickness of the silicon film PS2. Accordingly, over both the sidewalls of the control gate electrode CG, the silicon film PS2 is left in a sidewall spacer shape via the insulation film MZ, and the silicon film PS2 in other regions is removed. As a result, as shown in FIG. 24, over one sidewall of both the sidewalls of the control gate electrode CG, the memory gate electrode MG2 is formed of the silicon film PS2 left in a sidewall spacer shape via the insulation film MZ. Whereas, over the other sidewall, a silicon spacer PS2$a$ is formed of the silicon film PS2 left in a sidewall spacer shape via the insulation film MZ. The memory gate electrode MG2 is formed over the insulation film MZ in such a manner as to be adjacent to the control gate electrode CG via the insulation film MZ. The etch back step of Step S28 is performed, so that the portion of the insulation film MZ in the region not covered with the memory gate electrode MG2 and the silicon spacer PS2$a$ is exposed.

Figure 25:
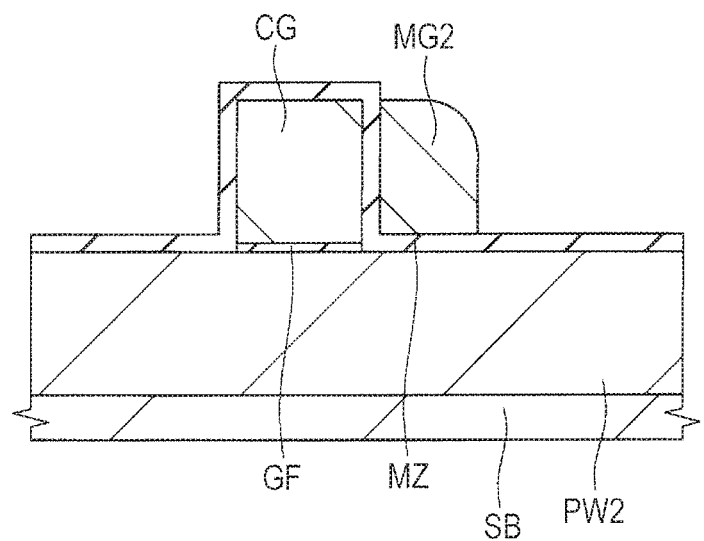
FIG. 25 is an essential part cross sectional view of the semiconductor device during a manufacturing step following FIG. 24.

Then, using a photolithography technology, such a photoresist pattern (not shown) as to cover the memory gate electrode MG2, and to expose the silicon spacer PS2$a$ is formed over the semiconductor substrate SB. Then, by dry etching using the photoresist pattern as an etching mask, the silicon spacer PS2$a$ is removed (Step S29 of FIG. 19). At this step, the memory gate electrode MG2 is not etched, and is left. Then, the photoresist pattern is removed. FIG. 25 shows this stage.

Figure 26:
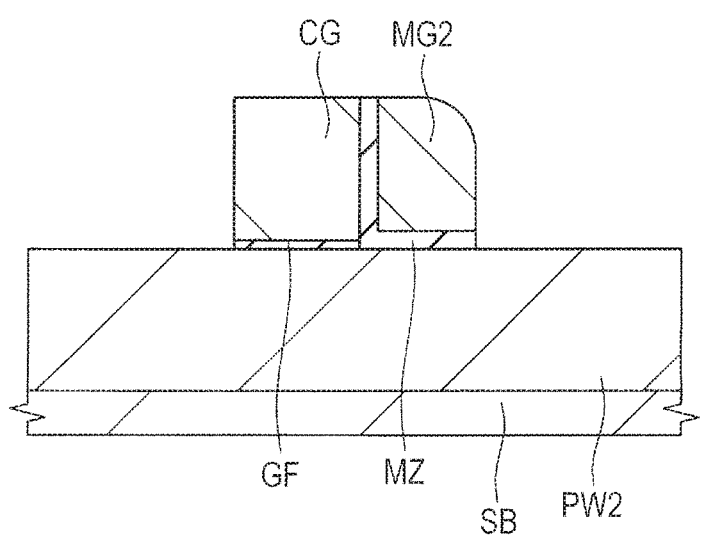
FIG. 26 is an essential part cross sectional view of the semiconductor device during a manufacturing step following FIG. 25.

Then, as shown in FIG. 26, the portions of the insulation film MZ not covered with the memory gate electrode MG2, and exposed are removed by etching (e.g., wet etching) (Step S30 of FIG. 19). At this step, the insulation film MZ situated under the memory gate electrode MG2, and between the memory gate electrode MG2 and the control gate electrode CG is not removed, and is left, and the insulation film MZ in other regions is removed. As also indicated from FIG. 26, the insulation film MZ extends continuously across both the regions of the region between the memory gate electrode MG2 and the semiconductor substrate SB (p type well PW2), and the region between the memory gate electrode MG2 and the control gate electrode CG.

Figure 27:
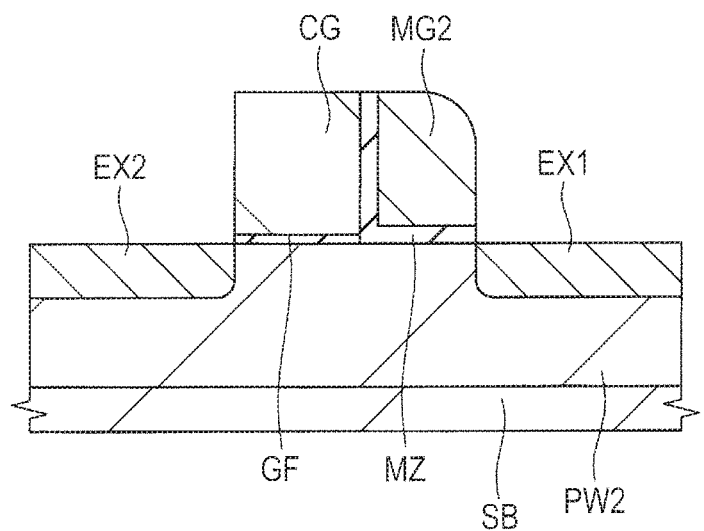
FIG. 27 is an essential part cross sectional view of the semiconductor device during a manufacturing step following FIG. 26.

Then, using an ion implantation method, or the like, an n type impurity is doped into the semiconductor substrate SB (p type well PW2) using the control gate electrode CG and the memory gate electrode MG2 as a mask (ion implantation inhibiting mask). As a result, as shown in FIG. 27, n$^-$ type semiconductor regions (impurity diffusion layers) EX1 and EX2 are formed (Step S31 of FIG. 19). At this step, the n$^-$ type semiconductor region EX1 is formed in self-alignment with the sidewall of the memory gate electrode MG2, and the n$^-$ type semiconductor region EX2 is formed in self-alignment with the sidewall of the control gate electrode CG.

Figure 28:
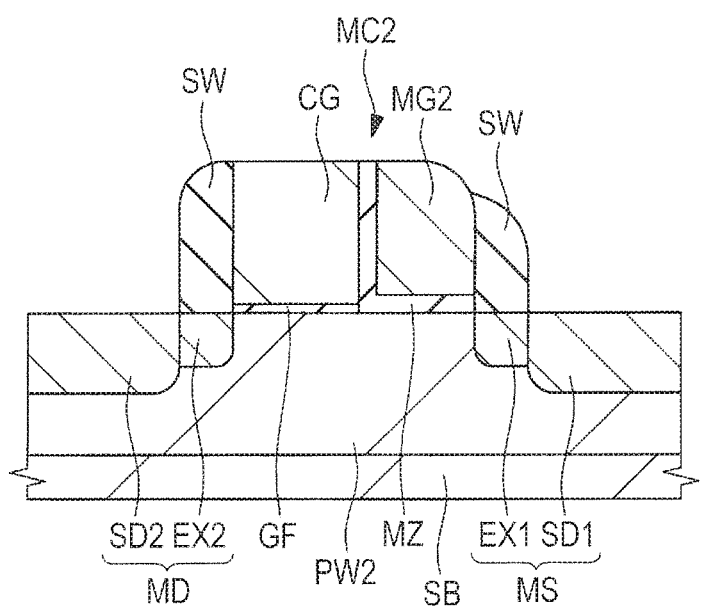
FIG. 28 is an essential part cross sectional view of the semiconductor device during a manufacturing step following FIG. 27.

Then, as shown in FIG. 28, over the sidewalls of the control gate electrode CG and the memory gate electrode MG2, sidewall spacers SW are formed as sidewall insulation films (Step S32 of FIG. 19), respectively. The formation method of the sidewall spacer SW is almost the same as that of Step S9. The sidewall spacers SW are formed over the sidewall of the sidewalls of the control gate electrode CG opposite to the sidewall on the side thereof adjacent to the memory gate electrode MG2 via the insulation film MZ, and over the sidewall of the sidewalls of the memory gate electrode MG2 opposite to the sidewall on the side thereof adjacent to the control gate electrode CG via the insulation film MZ.

Then, using an ion implantation method, or the like, an n type impurity is doped into the semiconductor substrate SB (p type well PW2) using the control gate electrode CG and the memory gate electrode MG2, and the sidewall spacers SW over the sidewalls thereof as a mask (ion implantation inhibiting mask), thereby to form n$^+$ type semiconductor regions SD1 and SD2 (Step S33 of FIG. 19). At this step, the n$^+$ type semiconductor region SD1 is formed in self-alignment with the sidewall spacer SW over the sidewall of the memory gate electrode MG2, and the n$^+$ type semiconductor region SD2 is formed in self-alignment with the sidewall spacer SW over the sidewall of the control gate electrode CG. As a result, a LDD structure is formed.

In this manner, the n$^-$ type semiconductor region EX1, and the n$^+$ type semiconductor region SD1 having a higher impurity density than that form an n type semiconductor region MS functioning as the source region of the memory transistor. The n$^-$ type semiconductor region EX2, and the n$^+$ type semiconductor region SD2 having a higher impurity density than that form an n type semiconductor region MD functioning as the drain region of the control transistor.

Then, activating annealing of the heat treatment for activating the impurity doped into the semiconductor regions (the n$^-$ type semiconductor regions EX1 and EX2 and the n$^+$ type semiconductor regions SD1 and SD2) for source and drain is performed (Step S34 of FIG. 19).

In this manner, the memory element MC2 of a nonvolatile memory is formed.

Figure 29:
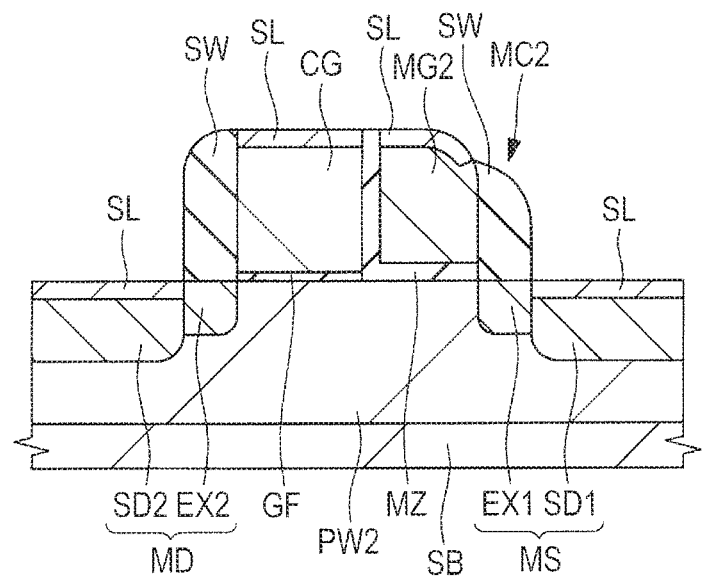
FIG. 29 is an essential part cross sectional view of the semiconductor device during a manufacturing step following FIG. 28.

Then, the salicide process as described by reference to FIG. 12 is performed. As a result, as shown in FIG. 29, the metal silicide layer SL is formed. The metal silicide layer SL can be formed at each top of the n$^+$ type semiconductor regions SD1 and SD2, the control gate electrode CG, and the memory gate electrode MG2.

The steps from this point forward in the case of FIG. 30 are also basically the same as those in the case of FIGS. 13 and 14.

That is, as shown in FIG. 30, entirely over the main surface of the semiconductor substrate SB, an insulation film IL1 is formed as an interlayer insulation film in such a manner as to cover the control gate electrode CG, the memory gate electrode MG2, and the sidewall spacers SW. Then, in the insulation film IL1, contact holes CT are formed. Then, a conductive plug PG is formed in each contact hole CT. Then, over the insulation film IL1 including the plug PG buried therein, an insulation film IL2 is formed. Then, a wiring trench is formed in the insulation film IL2. Thereafter, a wire M1 is formed in the wiring trench. Subsequently, by a dual damascene method, or the like, second- or higher-layer wires are formed.

<Details of Study>

Then, the details of study by the present inventors will be described.

Figure 31:
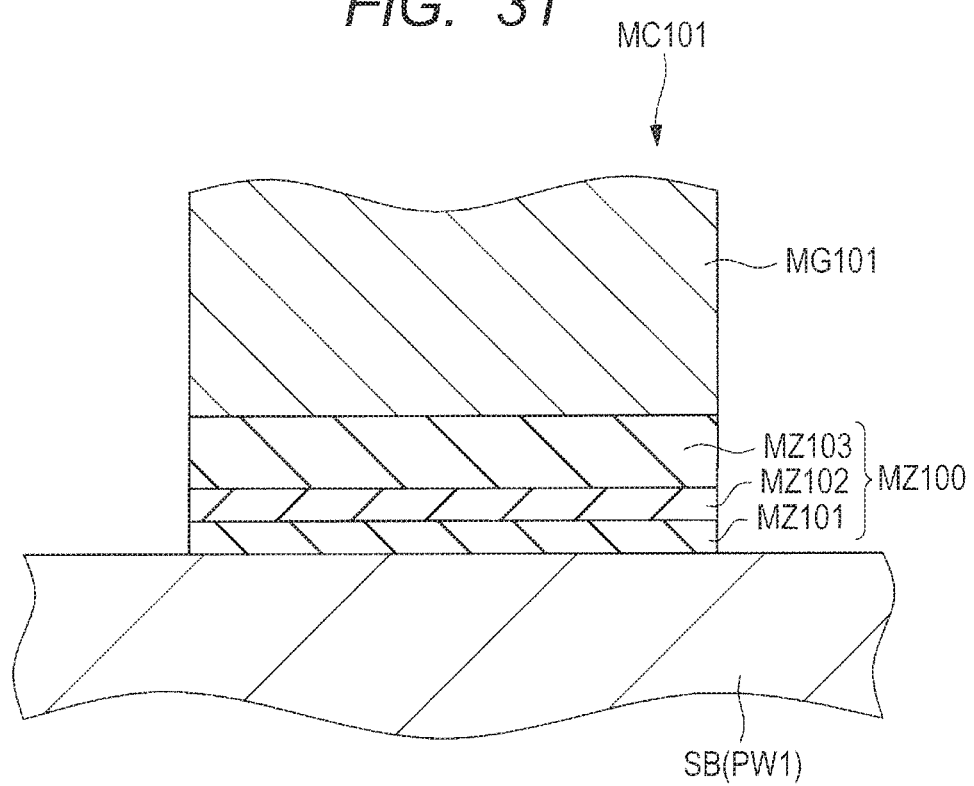
FIG. 31 is a partially enlarged cross sectional view showing a memory element of Study Example.

FIG. 31 is a partially enlarged cross sectional view showing a memory element MC101 of Study Example studied by the present inventors, and shows the region corresponding to FIG. 2.

In Study Example of FIG. 31, over the semiconductor substrate SB (p type well PW1), the gate electrode MG101 of the memory element MC101 is formed via a gate insulation film MZ100. The gate insulation film MZ100 of the memory element MC101 is formed of a lamination film of a charge accumulation film MZ102 of a trapping insulation film, a bottom insulation film MZ101 under the charge accumulation film MZ102, and a top insulation film MZ103 over the charge accumulation film MZ102, and has a structure in which the charge accumulation film MZ102 is interposed between the bottom insulation film MZ101 and the top insulation film MZ103. The bottom insulation film MZ101 and the top insulation film MZ103 each function as a charge block layer for confining electric charges in the charge accumulation film MZ102.

As the gate insulation film for memory element, an ONO (oxide-nitride-oxide) film of lamination of a silicon oxide film, a silicon nitride film, and a silicon oxide film is known. When the ONO film is adopted as the gate insulation film for memory element, the dielectric constant is relatively lower, resulting in an increase in EOT (Equivalent Oxide Thickness) of the gate insulation film. For this reason, an increase in EOT of the gate insulation film may result in an increase in operating voltage. Further, when the physical film thickness is tried to be reduced in order to reduce the EOT of the gate insulation film, deterioration of the retention characteristics (charge holding characteristics or data holding characteristics) due to leakage may be caused. These reduce the performances of the semiconductor device.

For this reason, the present inventors have conducted a study on the application of a high dielectric constant film to the gate insulation film MZ100 of the memory element MC101. By applying a high dielectric constant film to the gate insulation film MZ100 of the memory element MC101, it is possible to increase the physical film thickness of the gate insulation film MZ100 while suppressing the EOT of the gate insulation film MZ100. For this reason, it is possible to prevent the deterioration of the retention characteristics due to leakage, and to improve the retention characteristics. Further, while ensuring the physical film thickness of the gate insulation film MZ100, the EOT can be reduced. For this reason, it is possible to reduce the operating voltage, and improve the operating speed of the memory element while preventing the deterioration of the retention characteristics due to leakage.

The present inventors particularly focused attention on the top insulation film MZ103. The top insulation film MZ103 is a film largely affecting the retention characteristics of the memory element. Suppression of leakage at the top insulation film MZ103 is very important for improving the retention characteristics of the memory element. When a high dielectric constant film is applied to the top insulation film MZ103, the physical film thickness of the top insulation film MZ103 can be increased while suppressing the EOT of the top insulation film MZ103. For this reason, the electric charges accumulated in the charge accumulation film MZ102 can be suppressed from unintentionally passing through the top insulation film MZ103 to the gate electrode MG101. Accordingly, the retention characteristics of the memory element can be improved. Further, while ensuring the physical film thickness of the top insulation film MZ103, the EOT can be reduced. For this reason, the reduction of the operating voltage and the improvement of the operating speed of the memory element can be achieved.

Further, when a high dielectric constant film (a film having a higher dielectric constant than that of a silicon nitride film of high dielectric constant films) is applied to the charge accumulation film MZ102, while suppressing the EOT of the charge accumulation film MZ102, the physical film thickness of the charge accumulation film MZ102 can be increased. This also contributes to the improvement of the retention characteristics of the memory element. The reason for this is as follows.

That is, electric charges are discretely trapped by the trap level in the charge accumulation film MZ102. While electrons or holes are injected into the charge accumulation film MZ102, thereby to control the threshold voltage of the memory element, the electric charges moves in the inside of the charge accumulation film MZ102. However, the more distant the trap position in the charge accumulation film MZ102 is from the surfaces (the upper surface and the lower surface) of the charge accumulation film MZ102, the less likely the electric charges trapped in the charge accumulation film MZ102 are to be extracted from the charge accumulation film MZ102. That is, with an increase in thickness of the charge accumulation film MZ102, electric charges can be trapped at the more distant position from the surfaces of the charge accumulation film MZ102 in the charge accumulation film MZ102. For this reason, the electric charges trapped in the charge accumulation film MZ102 become less likely to be extracted from the charge accumulation film MZ102. When electric charges become less likely to be extracted from the charge accumulation film MZ102, the retention characteristics of the memory element is improved. Therefore, from the viewpoint of the retention characteristics, the physical film thickness of the charge accumulation film MZ102 is desirably increased. For this reason, by applying a high dielectric constant film (a film having a higher dielectric constant than that of a silicon nitride film of high dielectric constant films) to the charge accumulation film MZ102, the physical film thickness of the charge accumulation film MZ102 can be increased while suppressing the EOT of the charge accumulation film MZ102. For this reason, the retention characteristics can be improved.

When a high dielectric constant film is applied to the top insulation film MZ103, a high dielectric constant film having a larger band gap than the band gap of the charge accumulation film MZ102 is required to be used for the top insulation film MZ103. As the high dielectric constant film for the top insulation film MZ103, an insulation film formed of a material containing a metal and oxygen (O) (as constituent elements) can be preferably used. An aluminum oxide film, an aluminum oxynitride film, or an aluminum silicate film is preferably used, and an aluminum oxide film is in particular preferably used. The reason for this is as follows: an aluminum oxide film, an aluminum oxynitride film, and an aluminum silicate film, particularly an aluminum oxide film among them is good in film quality, and hence has a high insulating property, and further has a large band gap, and accordingly is suitable as a charge block layer.

Further, when a high dielectric constant film is applied to the charge accumulation film MZ102, an insulation film formed of amaterial containing hafnium (Hf) and oxygen (O) (as constituent elements) can be preferably used. A hafnium oxide film or a hafnium silicate film is particularly preferably used.

The occurrence of leakage at the top insulation film MZ103 largely affects the retention characteristics of the memory element, and hence is desirably minimized. The present inventors found the following: the top insulation film MZ103 is formed of the foregoing material (high dielectric constant material), and the top insulation film MZ103 is crystallized; as a result, the leakage at the top insulation film MZ103 can be suppressed, and the retention characteristics of the memory element can be improved (see FIG. 32).

Figure 32:
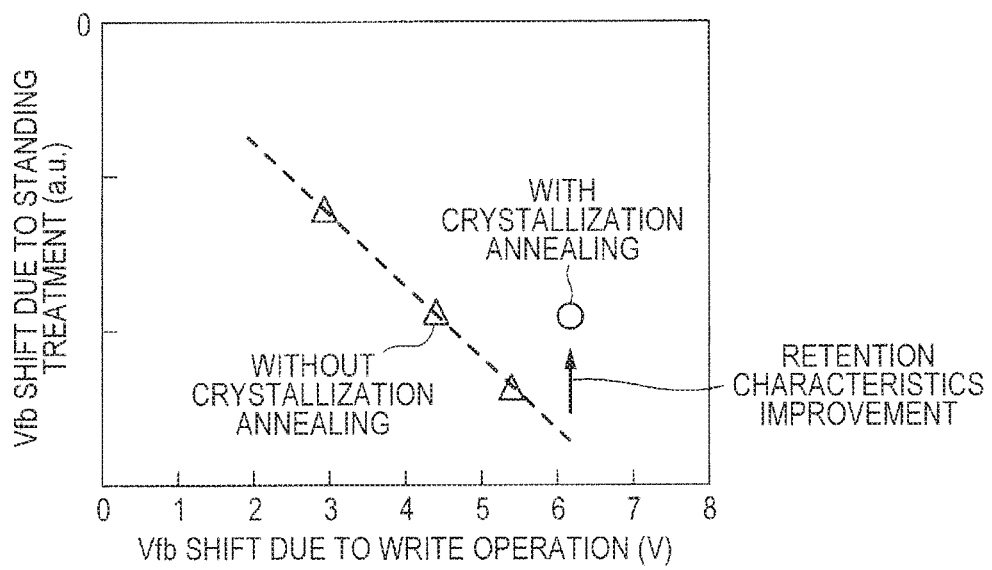
FIG. 32 is a graph showing the amount of fluctuations in flat band voltage of the memory element when allowed to stand under high temperatures after a write operation.

FIG. 32 is a graph showing the amount of fluctuations in flat band voltage of the memory element when allowed to stand under high temperatures after a write operation. The horizontal axis of the graph of FIG. 32 corresponds to the amount of fluctuations in flat band voltage (Vfb) due to the write operation, and specifically, corresponds to the difference between the flat band voltage immediately before the write operation and the flat band voltage immediately thereafter. Whereas, the horizontal axis of the graph of FIG. 32 corresponds to the amount of fluctuations in flat band voltage (Vfb) upon 1-hour standing at 150° C. after the write operation, and specifically, corresponds to the difference between the flat band voltage immediately after the write operation and the flat band voltage upon 1-hour standing at 150° C. after the write operation. Further, in the graph of FIG. 32, a triangle mark (Δ) corresponds the case where after deposition of the top insulation film MZ103, crystallization annealing is not performed, and accordingly, the top insulation film MZ103 becomes an amorphous film. Whereas, in the graph of FIG. 32, a circle mark (०) corresponds to the case where after deposition of the top insulation film MZ103, crystallization annealing is performed, and accordingly, the top insulation film MZ103 is crystallized, resulting in a polycrystal film. Incidentally, in the case of FIG. 32, as the top insulation film MZ103, an aluminum oxide film is used, and as the charge accumulation film MZ102, a hafnium silicate film is used. Further, it should be noted that as the horizontal axis of the graph of FIG. 32 goes away from zero, namely, goes downward, the amount of fluctuations in flat band voltage increases.

As also indicated from the graph of FIG. 32, as compared with the case where after deposition of the top insulation film MZ103, crystallization annealing is not performed (the case of the triangle mark), in the case where after deposition of the top insulation film MZ103, crystallization annealing is performed (the case of the circle mark), (the absolute value of) of the amount of fluctuations in the flat band voltage (Vfb) upon 1-hour standing at 150° C. after the write operation is smaller. This indicates as follows: as compared with the case where the top insulation film MZ103 is an amorphous film, in the case where the top insulation film MZ103 is crystallized, to become a polycrystal film, electric charges (herein, electrons) become less likely to be extracted from the charge accumulation film MZ102 into the gate electrode MG101; accordingly, the retention characteristics become better. When the top insulation film MZ103 is crystallized by crystallization annealing, to be a polycrystal film, electric charges become less likely to be extracted from the charge accumulation film MZ102. This is considered due to the following fact: the densification effect when the top insulation film MZ103 becomes a polycrystal film by crystallization annealing densifies the top insulation film MZ103, thereby to improve the film quality, resulting in a decrease in defects of causing leakage in the top insulation film MZ103, or the like.

For this reason, by forming the top insulation film MZ103 with the foregoing material (high dielectric constant material), and crystallizing the top insulation film MZ103, it is possible to suppress the leakage at the top insulation film MZ103, and it is possible to improve the retention characteristics of the memory element.

However, the present inventors have conducted a further study on the improvement of the retention characteristics. As a result, it has been indicated as follows: although the top insulation film MZ103 becomes a polycrystal film when crystallized, a phenomenon in which electric charges leak through the grain boundary of the polycrystal film, namely, a phenomenon in which electric charges (herein, electrons) are extracted from the charge accumulation film MZ102 to the gate electrode MG101 through the grain boundary of the polycrystal film may occur. This is because the grain boundary is an aggregate of defects, and tends to become a leakage path.

As described above, by crystallizing the top insulation film MZ103 by crystallization annealing, it is possible to improve the retention characteristics. However, it is difficult to strictly control the crystal grain size at the formed polycrystal film. Then, when as shown in FIG. 33, such a large crystal grain GR101a as to be adjacent to both of the charge accumulation film MZ102 and the gate electrode MG101 is formed, the charge accumulation film MZ102 and the gate electrode MG101 are connected to each other by the grain boundary GB101 extending in the thickness direction of the top insulation film MZ103.

Figure 33:
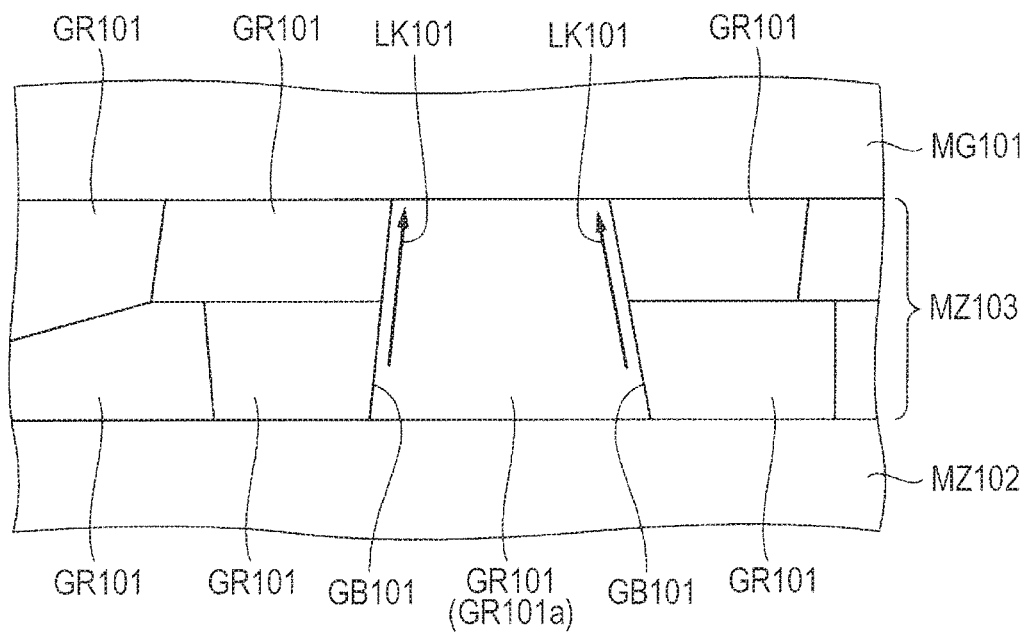
FIG. 33 is a partially enlarged cross sectional view showing a part of FIG. 31 on an enlarged scale.

Herein, FIG. 33 is a partially enlarged cross sectional view showing a part of FIG. 31 on an enlarged scale, and shows a part of the lamination structure of the charge accumulation film MZ102, the top insulation film MZ103, and the gate electrode MG101. For ease of understanding of the drawing, hatching is omitted although the drawing is a cross sectional view. Further, FIG. 33 shows that the top insulation film MZ103 is a polycrystal film, and hence the top insulation film MZ103 is formed of a plurality of (a large number of) crystal grains GR101.

In FIG. 33, the top insulation film MZ103 is formed of a plurality of (a large number of) crystal grains GR101. However, the crystal grain GR101a has a grain size equivalent to the thickness of the top insulation film MZ103, and is adjacent to both of the charge accumulation film MZ102 and the gate electrode MG101. This results in a state in which the grain boundaries (grain boundaries) GB101 forming the outer circumference of the crystal grain GR101a extend in the direction roughly equivalent to the thickness direction of the top insulation film MZ103, and connects the charge accumulation film MZ102 and the gate electrode MG101 in a short distance. The formation of such grain boundaries GB101 cause leakage (leakage at the leakage paths LK101 indicated with arrows in FIG. 33) between the charge accumulation film MZ102 and the gate electrode MG101 via the grain boundaries GB101. This may reduce the retention characteristics.

For this reason, for the improvement of the retention characteristics, it is necessary to prevent the formation of such a large crystal grain (GR101a) as to extend from the charge accumulation film MZ102 to the gate electrode MG101 in crystallizing the top insulation film MZ103.

However, strict control of the crystal grain size is difficult. Further, when the crystal grain size is tried to be forcedly suppressed, the film quality improvement due to densification becomes insufficient, resulting in degradation of the retention characteristics improvement effect due to crystallization.

For this reason, in order to improve the performances of a semiconductor device having a memory element, desirably, not only the top insulation film MZ103 is crystallized, but also further elaboration is achieved.

<Regarding Main Features and Effects>

The semiconductor device of the present embodiment has the semiconductor substrate SB, the insulation film MZ of the gate insulation film for the memory elements (MC1 and MC2) formed over the semiconductor substrate SB, and the gate electrodes (MG1 and MG2) for the memory elements (MC1 and MC2) formed over the insulation film MZ. The insulation film MZ has the insulation film MZ1 (first insulation film), the insulation film MZ2 (second insulation film) over the insulation film MZ1, the insulation film MZ3 (third insulation film) over the insulation film MZ2, the insulation film MZ4 (fourth insulation film) over the insulation film MZ3, and the insulation film MZ5 (fifth insulation film) over the insulation film MZ4. The insulation film MZ2 is an insulation film having a charge accumulation function. Each band gap of the insulation film MZ1 and the insulation film MZ3 is larger than the band gap of the insulation film MZ2. Then, the insulation film MZ3 is a polycrystal film formed of a high dielectric constant material containing a metallic element and oxygen. The insulation film MZ5 is a polycrystal film formed of the same material as that for the insulation film MZ3. The insulation film MZ4 is formed of a different material from that for the insulation film MZ3. This is common between the memory element MC1 of FIGS. 1 and 2 and the memory element MC2 of FIG. 15. That is, in the case of the memory element MC1 of FIGS. 1 and 2, over the semiconductor substrate SB, the gate electrode MG1 for the memory element MC1 is formed via the insulation film MZ of the gate insulation film for the memory element MC1. In the case of the memory element MC2 of FIG. 15, over the semiconductor substrate SB, the gate electrode MG2 for the memory element MC2 is formed via the insulation film MZ of the gate insulation film for the memory element MC2.

The semiconductor device of the present embodiment is a semiconductor device having a nonvolatile memory element. The gate insulation film (herein, the insulation film MZ) of the memory element includes an insulation film (herein, the insulation film MZ2) having a charge accumulation function. Electric charges are accumulated or held in the insulation film having a charge accumulation function, which enables of storing of information. Further, the insulation film MZ2 having a charge accumulation function is interposed between the insulation film MZ1 and the insulation film MZ3 each having a larger band gap than the band gap of the insulation film MZ2. As a result, the insulation film MZ2 can function as a charge accumulation layer. The insulation film MZ3 and the insulation film MZ1 interposing the insulation film MZ2 therebetween can each function as a charge block layer.

One of the main features of the present embodiment is as follows: the lamination film LM having the insulation film MZ3, the insulation film MZ4 thereover, and the insulation film MZ5 thereover is interposed between the insulation film MZ2 having a charge accumulation function and the gate electrodes (MG1 and MG2). The insulation film MZ3 is a polycrystal film formed of a high dielectric constant material containing a metallic element and oxygen. The insulation film MZ5 is a polycrystal film formed of the same material as that for the insulation film MZ3. The insulation film MZ4 is formed of a different material from that for the insulation film MZ3.

That is, in the present embodiment, for the gate insulation film (herein, the insulation film MZ) of the memory element, there is adopted a structure in which the charge accumulation film (herein, the insulation film MZ2) is interposed between the bottom insulation film (herein, the insulation film MZ1) under the charge accumulation film, and the top insulation film over the charge accumulation film. In addition, as the top insulation film, a lamination film of the insulation film MZ3, the insulation film MZ4, and the insulation film MZ5 is used. The configuration of the top insulation film is one of the main features of the present embodiment.

The insulation film MZ3 is a polycrystal film formed of a high dielectric constant material containing a metallic element and oxygen, and the insulation film MZ5 is a polycrystal film formed of the same material as that for the insulation film MZ3. For this reason, unless the insulation film MZ4 is present between the insulation film MZ3 and the insulation film MZ5, the insulation film MZ3 and the insulation film MZ5 ought to become one polycrystal film together because the insulation films MZ3 and MZ5 are formed of polycrystal of the same material. In other words, the structure of the lamination film LM of the insulation film MZ3, the insulation film MZ4, and the insulation film MZ5 is similar to the structure in which the insulation film MZ4 is inserted into the film (halfway of the thickness) of one polycrystal film formed of the same material as that for the insulation film MZ3. Thus, comparing the case where the top insulation film is formed of one polycrystal film, and the case where the top insulation film is formed of a lamination film of the insulation film MZ3, the insulation film MZ4, and the insulation film MZ5, the advantages of the latter case will be described below.

The case where the top insulation film is formed of one polycrystal film corresponds to the case where in the Study Example of FIG. 31, the top insulation film MZ103 is crystallized, to be formed as a polycrystal film. For example, in the Study Example of FIG. 31, as the top insulation film MZ103, a polycrystal film formed of aluminum oxide can be used. However, as described in the section of the details of study, when the top insulation film MZ103 is formed of a one-layer polycrystal film, such a large crystal grain GR101a as to be adjacent to both of the charge accumulation film MZ102 and the gate electrode MG101 as in FIG. 33 may be formed. The formation of such a large crystal grain GR101a in the top insulation film MZ103 results in a state in which the grain boundaries GB101 forming the outer circumference of the crystal grain GR101a connect the charge accumulation film MZ102 and the gate electrode MG101. Accordingly, the leakage between the charge accumulation film MZ102 and the gate electrode MG101 may be caused via the grain boundaries GB101, thereby to reduce the retention characteristics of the memory element.

In contrast, in the present embodiment, as the top insulation film, the structure formed of only one polycrystal film is not adopted, but the structure in which the insulation film MZ4 is inserted into the film (halfway of the thickness) of the polycrystal film is adopted. That is, as the top insulation film, there is adopted the structure in which between two polycrystal films (herein, the insulation film MZ3 and the insulation film MZ5) formed of the same material, the insulation film MZ4 formed of a different material from that for the polycrystal films is inserted. As a result, the crystal grains forming the insulation film MZ3, and the crystal grains forming the insulation film MZ5 are divided (separated) by the insulation film MZ4. For this reason, it is possible to prevent the integration of the crystal grains forming the insulation film MZ3 and the crystal grains forming the insulation film MZ5. This can suppress the leakage between the insulation film MZ2 (charge accumulation film) and the gate electrodes (MG1 and MG2) via the grain boundaries. Accordingly, it is possible to improve the retention characteristics of the memory element. Therefore, it is possible to improve the performances of the semiconductor device having a memory element. This will be further described by reference to FIGS. 34 to 36.

Figure 34:
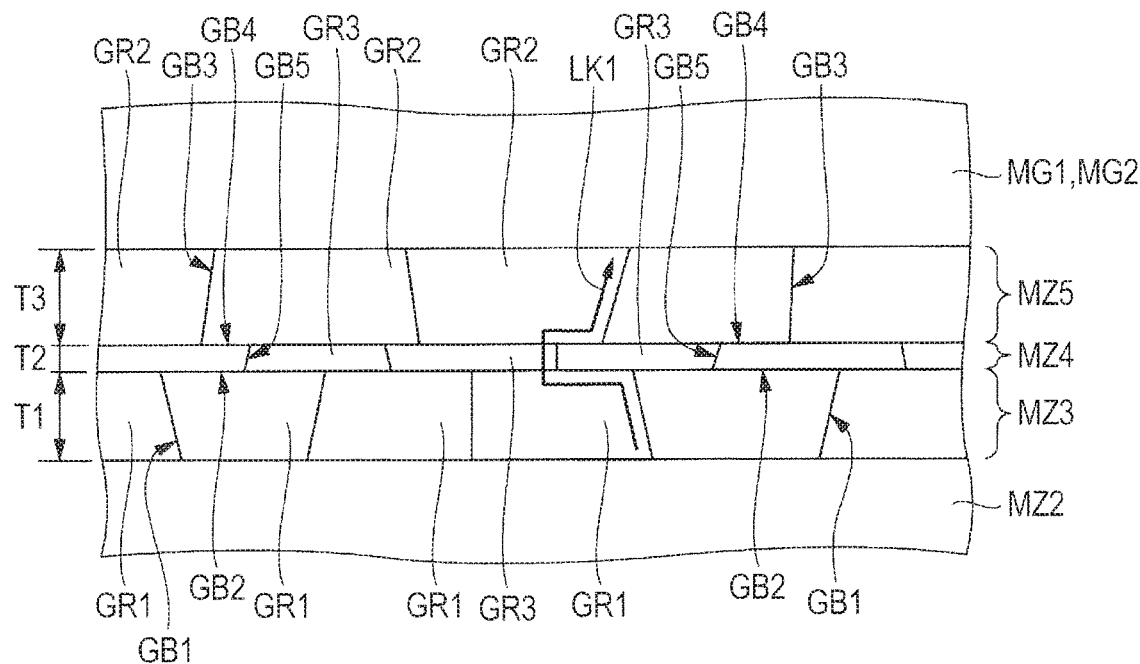
FIG. 34 is a partially enlarged cross sectional view showing a part of FIG. 2 or 15 on an enlarged scale.

FIG. 34 is a partially enlarged cross sectional view showing a part of FIG. 2 or 15 on an enlarged scale, and shows a part of the lamination structure of the insulation film MZ2, the insulation film MZ3, the insulation film MZ4, the insulation film MZ5, and the gate electrodes (MG1 and MG2). For ease of understanding of the drawing, hatching is omitted although the drawing is a cross sectional view. The insulation film MZ3 and the insulation film MZ5 are both polycrystal films. For this reason, FIG. 34 shows that the insulation film MZ3 is formed of a plurality of (a large number of) crystal grains GR1, and that the insulation film MZ5 is formed of a plurality of (a large number of) crystal grains GR2. The plurality of crystal grains GR1 forming the insulation film MZ3, and the plurality of crystal grains GR2 forming the insulation film MZ5 are separated from each other by the insulation film MZ4 interposed between the insulation film MZ3 and the insulation film MZ5.

In the present embodiment, the insulation films MZ3 and MZ5 are both crystallized to be polycrystal films. For this reason, as shown in FIG. 34, the insulation film MZ3 is formed of the plurality of crystal grains GR1, and the insulation film MZ5 is formed of the plurality of crystal grains GR2. The crystal grains GR1 forming the insulation film MZ3, and the crystal grains GR2 forming the insulation film MZ5 are formed of the mutually same material, and hence have the mutually same crystal structure. For this reason, unless the insulation film MZ4 is present, the crystal grains GR1 forming the insulation film MZ3, and the crystal grains GR2 forming the insulation film MZ5 may be integrated. Therefore, such a large crystal grain as to be adjacent to both of the insulation film MZ2 (charge accumulation film) and the gate electrodes (MG1 and MG2) may be formed. However, in the present embodiment, the insulation film MZ4 formed of a different material from that for the insulation films MZ3 and MZ5 is interposed between the insulation film MZ3 and the insulation film MZ5. For this reason, the crystal grains GR1 forming the insulation film MZ3 and the crystal grains GR2 forming the insulation film MZ5 are not integrated. Thus, the crystal grains GR1 forming the insulation film MZ3 and the crystal grains GR2 forming the insulation film MZ5 can be divided (separated) from each other forcedly by the insulation film MZ4.

Figure 35:
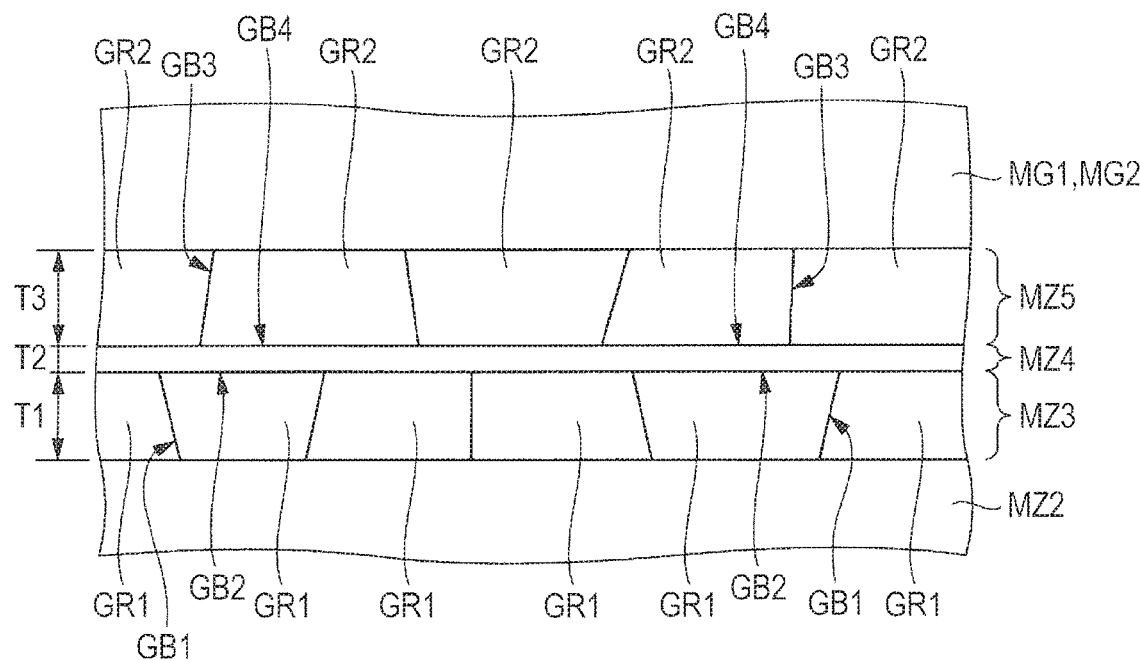
FIG. 35 is a partially enlarged cross sectional view showing a part of FIG. 2 or 15 on an enlarged scale.

Incidentally, the insulation film MZ4 may be crystallized or may not be crystallized according to the constituent material. For example, when the insulation film MZ4 is formed of a metal oxide film, a metal silicate film, or a metal oxynitride film, upon crystallization of the insulation films MZ3 and MZ5 by the crystallization annealing of Step S4 or S26, the insulation film MZ4 is also crystallized. For this reason, the insulation film MZ4 may also become a polycrystal film. FIG. 34 shows the case where the insulation film MZ4 is crystallized to be a polycrystal film. The insulation film MZ4 is formed of a plurality of (a large number of) crystal grains GR3. On the other hand, when the insulation film MZ4 is a silicon oxide film, a silicon nitride film, or a silicon oxynitride film, upon crystallization of the insulation films MZ3 and MZ5 by the crystallization annealing of Step S4 or S26, the insulation film MZ4 is not crystallized. Therefore, also in the manufactured semiconductor device, the insulation film MZ4 is not crystallized, and is an amorphous film. FIG. 35 is a cross sectional view corresponding to FIG. 34. FIG. 35 shows the case where the insulation film MZ4 is not crystallized, and is an amorphous film. Further, according to the material for the insulation film MZ4, and the conditions for the crystallization annealing of Step S4 or S26 (such as annealing temperature), the region where the insulation film MZ4 is crystallized, and the amorphous or microcrystalline region may coexist. As with the case of FIG. 34, also in the case of FIG. 35, the plurality of crystal grains GR1 forming the insulation film MZ3 and the plurality of crystal grains GR2 forming the insulation film MZ5 are separated from each other by the insulation film MZ4 interposed between the insulation film MZ3 and the insulation film MZ5.

When the insulation film MZ4 is an amorphous film as in FIG. 35, the crystal grains GR1 forming the insulation film MZ3 (polycrystal film) and the crystal grains GR2 forming the insulation film MZ5 (polycrystal film) are forcedly divided (separated) from each other by the amorphous insulation film MZ4. For this reason, the crystal grains GR1 forming the insulation film MZ3, and the crystal grains GR2 forming the insulation film MZ5 can be prevented from being integrated with each other. Incidentally, in order for the insulation films MZ3 and MZ5 to be polycrystal films, but for the insulation film MZ4 to be an amorphous film, the insulation film MZ4 is required to be formed of a different material from that for the insulation films MZ3 and MZ5. This is due to the following fact: if the insulation film MZ4 is formed of the same material as that for the insulation films MZ3 and MZ5, upon crystallization of the insulation films MZ3 and MZ5 by the crystallization annealing of Step S4 or S26, the insulation film MZ4 is also crystallized.

Even if the insulation film MZ4 is crystallized as in FIG. 34, when the insulation film MZ4 is formed of a different material from that for the insulation films MZ3 and MZ5, the crystal grains GR3 forming the insulation film MZ4 are hardly integrated with the crystal grains GR1 forming the insulation film MZ3, and the crystal grains GR2 forming the insulation film MZ5. For this reason, the crystal grains GR1 forming the insulation film MZ3 (polycrystal film), and the crystal grains GR2 forming the insulation film MZ5 (polycrystal film) are forcedly divided by the insulation film MZ4 (polycrystal film) formed of a different material from that for the insulation films MZ3 and MZ5. This can prevent the integration of the crystal grains GR1 forming the insulation film MZ3 and the crystal grains GR2 forming the insulation film MZ5.

For this reason, in either case of FIG. 34 and FIG. 35, namely, irrespective of whether the insulation film MZ4 is crystallized, or not, the crystal grains GR1 forming the insulation film MZ3 and the crystal grains GR2 forming the insulation film MZ5 are forcedly divided by the insulation film MZ4. This can prevent the integration of the crystal grains GR1 forming the insulation film MZ3 and the crystal grains GR2 forming the insulation film MZ5. Therefore, it is possible to prevent the formation of such a large crystal grain (corresponding to the crystal grain GR101a of FIG. 33) as to be adjacent to both of the insulation film MZ2 (charge accumulation film) and the gate electrodes (MG1 and MG2) in the top insulation film, namely, between the insulation film MZ2 (charge accumulation film) and the gate electrodes (MG1 and MG2).

Unless such a large crystal grain (corresponding to the crystal grain GR101a of FIG. 33) as to be adjacent to both of the insulation film MZ2 (charge accumulation film) and the gate electrodes (MG1 and MG2) is formed, it is possible to suppress the leakage between the insulation film MZ2 (charge accumulation film) and the gate electrodes (MG1 and MG2) via the grain boundaries. The reasons for this are as follows.

First, as one of the reasons, as compared with the leakage path LK101 via the grain boundaries in the case of FIG. 33 (Study Example), in the case of FIG. 34 (the present embodiment), the length of the leakage path LK1 via the grain boundaries can be set larger. Herein, the leakage paths LK1 and LK101 are the leakage paths between the charge accumulation films (MZ2 and MZ102) and the gate electrodes (MG1 and MG2, and MG101), respectively, and are leakage paths through the grain boundaries. Further, the leakage herein described corresponds to the phenomenon in which the electric charges (herein, electrons) accumulated in the charge accumulation films (MZ2 and MZ102) are extracted to the gate electrodes (MG1 and MG2, and MG101), respectively.

When such a large crystal grain GR101a as to be adjacent to both of the charge accumulation film MZ102 and the gate electrode MG101 is formed as in FIG. 33, the grain boundaries GB101 forming the outer circumference of the crystal grain GR101a connect the charge accumulation film MZ102 and the gate electrode MG101 in a short distance. Accordingly, the length of the leakage path LK101 through each grain boundary GB101 becomes shorter. For this reason, the leakage becomes more likely to be caused at the leakage path LK101. In contrast, in the case of FIG. 34, the crystal grains GR1 forming the insulation film MZ3 and the crystal grains GR2 forming the insulation film MZ5 are divided by the insulation film MZ4. Accordingly, a short-distance leakage path such as the leakage path LK101 is not formed. Thus, the length of the leakage path LK1 through the grain boundaries can be set longer than the length of the leakage path LK101 (i.e., L1>L101). The likelihood of occurrence of leakage through grain boundaries decreases with an increase in length of the leakage path through grain boundaries. In the case of FIG. 34 (the present embodiment), the length of the leakage path LK1 through grain boundaries can be increased. For this reason, it is possible to suppress the leakage between the insulation film MZ2 (charge accumulation film) and the gate electrodes (MG1 and MG2) through grain boundaries. Thus, the retention characteristics of the memory element can be improved.

Another of the reasons is as follows. The insulation film MZ4 is interposed between the insulation film MZ3 (polycrystal film) and the insulation film MZ5 (polycrystal film). As a result, at the leakage path LK1 through grain boundaries, not only the grain boundaries (GB1, GB3, and GB5) extending in the thickness direction of the insulation film MZ, but also the grain boundaries (GB2 and GB4) extending in the plane direction of the insulation film MZ are also allowed to be present. In FIG. 34, the grain boundary GB2 is the grain boundary present at the interface between the insulation film MZ3 and the insulation film MZ4, and the grain boundary GB4 is present at the interface between the insulation film MZ4 and the insulation film MZ5, and hence is the grain boundary extending in the plane direction of the insulation film MZ. The grain boundaries GB2 and GB4 extend in the plane direction of the insulation film MZ. On the other hand, in FIG. 34, the grain boundary GB1 is the gain boundary formed between the crystal grains GR1 adjacent in the plane direction in the insulation film MZ3, the grain boundary GB3 is the grain boundary formed between the crystal grains GR2 adjacent in the plane direction in the insulation film MZ5, and the grain boundary GB5 is the grain boundary formed between the crystal grains GR3 adjacent in the plane direction in the insulation film MZ4. The grain boundaries GB1, GB3, and GB5 extend in the direction roughly corresponding to the thickness direction of the insulation film MZ. When the gate electrodes (MG1 and MG2) are applied with a voltage, in the insulation film MZ, an electric field is generated in the thickness direction of the insulation film MZ. For this reason, the grain boundaries (GB1, GB3, and GB5) extending in the thickness direction of the insulation film MZ can be said to be the grain boundaries susceptible to leakage. In contrast, the grain boundaries (GB2 and GB4) extending in the plane direction of the insulation film MZ are the grain boundaries less susceptible to leakage. For this reason, in the case of FIG. 34 (the present embodiment), the grain boundaries (GB2 and GB4) extending in the plane direction of the insulation film MZ can also be allowed to be present at the leakage path LK1 through grain boundaries. Accordingly, it is possible to suppress the leakage between the insulation film MZ2 (charge accumulation film) and the gate electrodes (MG1 and MG2) through the grain boundaries. Thus, the retention characteristics of the memory element can be improved.

Thus, in the case of FIG. 34 (when the insulation film MZ4 is a polycrystal film), the length of the leakage path LK1 through grain boundaries can be increased, and at the leakage path LK1 through grain boundaries, the grain boundaries (GB2 and GB4) extending in the plane direction of the insulation film MZ can also be allowed to be present. As a result, it is possible to suppress the leakage between the insulation film MZ2 (charge accumulation film) and the gate electrodes (MG1 and MG2) through grain boundaries. Accordingly, the retention characteristics of the memory element can be improved.

Further, FIG. 35 corresponds to the case where the insulation film MZ4 is an amorphous film. In this case (the case of FIG. 35), the insulation film MZ4 (amorphous film) is present between the insulation film MZ3 (polycrystal film) and the insulation film MZ5 (polycrystal film). For this reason, the grain boundaries in the insulation film MZ3 and the grain boundaries in the insulation film MZ5 are not connected by the grain boundaries in the insulation film MZ4. This prevents the insulation film MZ2 (charge accumulation film) and the gate electrodes (MG1 and MG2) from being connected only through the grain boundaries. For this reason, also in the case of FIG. 35 (when the insulation film MZ4 is an amorphous film), it is possible to suppress the leakage between the insulation film MZ2 (charge accumulation film) and the gate electrodes (MG1 and MG2) through grain boundaries. Accordingly, the retention characteristics of the memory element can be improved.

Therefore, in either case of FIG. 34 and FIG. 35, namely, irrespective of whether the insulation film MZ4 is crystallized, or not, it is possible to prevent the formation of such a large crystal grain as to be adjacent to both of the insulation film MZ2 and the gate electrodes (MG1 and MG2). Accordingly, it is possible to suppress the leakage between the insulation film MZ2 and the gate electrodes through grain boundaries. For this reason, the retention characteristics of the memory element can be improved. Therefore, the performances of the semiconductor device having a memory element can be improved.

The insulation film MZ4 has a role of dividing (separating) the crystal grains GR1 forming the insulation film MZ3 and the crystal grains GR2 forming the insulation film MZ5 by the insulation film MZ4, and preventing the integration of the crystal grains GR1 forming the insulation film MZ3 and the crystal grains GR2 forming the insulation film MZ5. In order for this role to be played with precision, the insulation film MZ4 is required to satisfy at least one of the following requirements: the insulation film MZ4 is formed of a different material from that for the insulation films MZ3 and MZ5; or the insulation film MZ4 has a different crystal structure from those of the insulation films MZ3 and MZ5.

When the insulation film MZ4 is formed of a different material from that for the insulation films MZ3 and MZ5, the crystal grains GR1 forming the insulation film MZ3 and the crystal grains GR2 forming the insulation film MZ5 can be divided by the insulation film MZ4, thereby to prevent the integration of the crystal grains GR1 forming the insulation film MZ3 and the crystal grains GR2 forming the insulation film MZ5. Incidentally, the insulation film MZ3 and the insulation film MZ5 are formed of the mutually same material, and hence are also equal to each other in crystal structure. On the other hand, when the insulation film MZ4 is formed of a different material from that for the insulation films MZ3 and MZ5, the insulation film MZ4 often has a different crystal structure from those of the insulation films MZ3 and MZ5. However, even if the crystal structures are the same or similar, the action of dividing the crystal grains GR1 forming the insulation film MZ3 and the crystal grains GR2 forming the insulation film MZ5 by the insulation film MZ4 can be provided.

Alternatively, also when the insulation film MZ4 has a different crystal structure from those of the insulation films MZ3 and MZ5, it is possible to divide the crystal grains GR1 forming the insulation film MZ3 and the crystal grains GR2 forming the insulation film MZ5 by the insulation film MZ4, and to prevent the integration of the crystal grains GR1 forming the insulation film MZ3 and the crystal grains GR2 forming the insulation film MZ5. For example, it is supposed as follows: the insulation film MZ3, the insulation film MZ4, and the insulation film MZ5 are all formed of a metal silicate film; the metal included in the insulation film MZ3, the metal included in the insulation film MZ4, and the metal included in the insulation film MZ5 are the same. In this case, the constituent elements are common among the insulation film MZ3, the insulation film MZ4, and the insulation film MZ5. However, in terms of the composition ratio, the insulation film MZ3 and the insulation film MZ5 are equal to each other, and the insulation film MZ4 is different from the insulation films MZ3 and MZ5. Then, by crystallization annealing, all of the insulation films MZ3, MZ4, and MZ5 are crystallized, resulting in polycrystal films. The insulation film MZ3 and the insulation film MZ5 have the same crystal structure. However, the insulation film MZ4 may have a different crystal structure from that of the insulation films MZ3 and MZ5 according to the difference in composition ratio. In such a case, the crystal grains GR3 forming the insulation film MZ4 have a different crystal structure from those of the crystal grains GR1 and GR2 forming the insulation films MZ3 and MZ5. Accordingly, it is possible to divide the crystal grains GR1 forming the insulation film MZ3 and the crystal grains GR2 forming the insulation film MZ5 by the insulation film MZ4, thereby to prevent the integration of the crystal grains GR1 forming the insulation film MZ3 and the crystal grains GR2 forming the insulation film MZ5.

For this reason, a description has been given by assuming that the insulation film MZ4 is formed of a different material from that for the insulation films MZ3 and MZ5. However, the present embodiment is also applicable to the case where the insulation film MZ4 has a different crystal structure from that of the insulation films MZ3 and MZ5.

Further, in the present embodiment, for the insulation films MZ3 and MZ5, a high dielectric constant material containing a metal and oxygen is used. As a result, the dielectric constants of the insulation films MZ3 and MZ5 can be increased, thereby to increase the physical film thickness of the lamination film LM while suppressing the EOT of the lamination film LM (top insulation film). Accordingly, the retention characteristics of the memory element can be improved. Further, while ensuring the physical film thickness of the lamination film LM, the EOT can be reduced. For this reason, the reduction of the operating voltage, and the improvement of the operating speed of the memory element can be achieved.

From this viewpoint, a high dielectric constant material is more preferably used not only for the insulation films MZ3 and MZ5, but also for the insulation film MZ4. When a high dielectric constant material is also used for the insulation film MZ4, while suppressing the EOT of the lamination film LM (top insulation film), the physical film thickness of the lamination film LM can be further increased. Accordingly, the retention characteristics of the memory element can be further improved. Furthermore, while ensuring the physical film thickness of the lamination film LM, the EOT can be further reduced. Accordingly, the reduction of the operating voltage and further improvement of the operating speed of the memory element can be achieved.

For this reason, as the insulation film MZ4, a metal oxide film (oxidized metal film), a metal silicate film, or a metal oxynitride film (oxynitride metal film) of a high dielectric constant film can be preferably used. For example, oxide, silicate or oxynitride of one or more metals selected from the group consisting of Ti (titanium), Zr (zirconium), Y (yttrium), La (lanthanum), Pr (praseodymium), and Lu (lutetium) can be preferably used as the material (high dielectric constant material) for the insulation film MZ4.

Further, as described above, as the insulation film MZ4, a high dielectric constant material (preferably, a metal oxide, a metal silicate, or a metal oxynitride) is more preferably used. However, other materials than a high dielectric constant material can also be used. Specifically, a silicon oxide film, a silicon oxynitride film, or a silicon nitride film can also be preferably used as the insulation film MZ4. When a silicon oxide film, a silicon oxynitride film, or silicon nitride film is used as the insulation film MZ4, upon crystallizing the insulation films MZ3 and MZ5 by crystallization annealing (Step S4 or S26), the insulation film MZ4 has not been crystallized, and has been still in an amorphous state. For this reason, the crystal grains GR1 forming the insulation film MZ3 and the crystal grains GR2 forming the insulation film MZ5 are forcedly divided by the amorphous insulation film MZ4. Accordingly, it is possible to prevent the integration of the crystal grains GR1 forming the insulation film MZ3 and the crystal grains GR2 forming the insulation film MZ5.

Further, of a silicon oxide film, a silicon oxynitride film, and a silicon nitride film, a silicon oxide film is more preferable as the insulation film MZ4. This is because the film having the smallest trap level of a silicon oxide film, a silicon oxynitride film, and a silicon nitride film is a silicon oxide film. When a silicon oxide film is used as the insulation film MZ4, by reducing the trap level in the insulation film MZ4, it is possible to suppress or prevent the electric charges from being trapped into the insulation film MZ4. As a result, it is possible to suppress or prevent the electric charges from being unintentionally trapped in other films than the insulation film MZ2. Accordingly, it is possible to improve the performances of the memory element.

Whereas, as the insulation films MZ3 and MZ5, a high dielectric constant film formed of a material containing a metal and oxygen (O) (as constituent elements) can be used. An aluminum oxide film, an aluminum oxynitride film, or an aluminum silicate film is preferably used, and an aluminum oxide film is particularly preferably used. The reason for this is as follows: an aluminum oxide film, an aluminum oxynitride film, and an aluminum silicate film, particularly, an aluminum oxide film among them has a good film quality, and hence has a high insulation property, and has a large band gap, and hence is suitable for the charge block layer.

Alternatively, in the case where mutually different materials are used for the insulation film MZ3 and the insulation film MZ5 as distinct from the present embodiment, when a material suitable as a charge block film is used for one of the insulation films MZ3 and MZ5, a material inferior thereto must be used for the other of the insulation films MZ3 and MZ5. In the present embodiment, the insulation film MZ3 and the insulation film MZ5 are formed of the mutually same material. For this reason, a common material suitable as a charge block film can be used for both of the insulation film MZ3 and the insulation film MZ5. Accordingly, the lamination film LM becomes more likely to exert the function as a charge block film.

Further, a high dielectric constant material (preferably, a material having a higher dielectric constant than that of silicon nitride) is also preferably used for the insulation film MZ2 of a charge accumulation film. In that case, as the insulation film MZ2, an insulation film formed of a material containing hafnium (Hf) and oxygen (O) (as constituent elements) can be preferably used. A hafnium oxide film or a hafnium silicate film is particularly preferably used.

Further, in the present embodiment, in consideration of the reliability of the semiconductor device, as the insulation film MZ1 interposed between the charge accumulation film (MZ2) and the semiconductor substrate SB, a silicon oxide film or a silicon oxynitride film is used. As the insulation film MZ1 to be formed over the semiconductor substrate SB, a silicon oxide film or a silicon oxynitride film is used. As a result, it is possible to improve the reliability of the semiconductor device having a memory element. As another aspect, as the insulation film MZ1, a high dielectric constant film (preferably a film having a higher dielectric constant than that of a silicon nitride film) can also be used. In that case, while ensuring the physical film thickness of the insulation film MZ1, the EOT can be reduced. Accordingly, it is possible to achieve the reduction of the operating voltage and a further improvement of the operating speed of the memory element.

Further, as shown in FIGS. 34 and 35, a plurality of crystal grains GR1 forming the insulation film MZ3 preferably includes crystal grains adjacent to both of the insulation film MZ2 and the insulation film MZ4. Further, as in FIGS. 34 and 35, a plurality of crystal grains GR2 forming the insulation film MZ5 preferably include crystal grains adjacent to both of the insulation film MZ4 and the gate electrodes (MG1 and MG2). This results in a state in which the insulation films MZ3 and MZ5 are sufficiently crystallized, and densified, and are improved in film quality. Accordingly, it is possible to precisely obtain retention characteristics improving effect by crystallization. Further, even when the insulation films MZ3 and MZ5 are sufficiently crystallized, the insulation film MZ4 is interposed between the insulation film MZ3 and the insulation film MZ5. Accordingly, the crystal grains GR1 forming the insulation film MZ3 and a plurality of crystal grains GR2 forming the insulation film MZ5 will not be integrated. For this reason, it is possible to suppress the leakage between the insulation film MZ2 and the gate electrodes (MG1 and MG2) via grain boundaries. Accordingly, it is possible to further improve the retention characteristics of the memory element.

Figure 36:
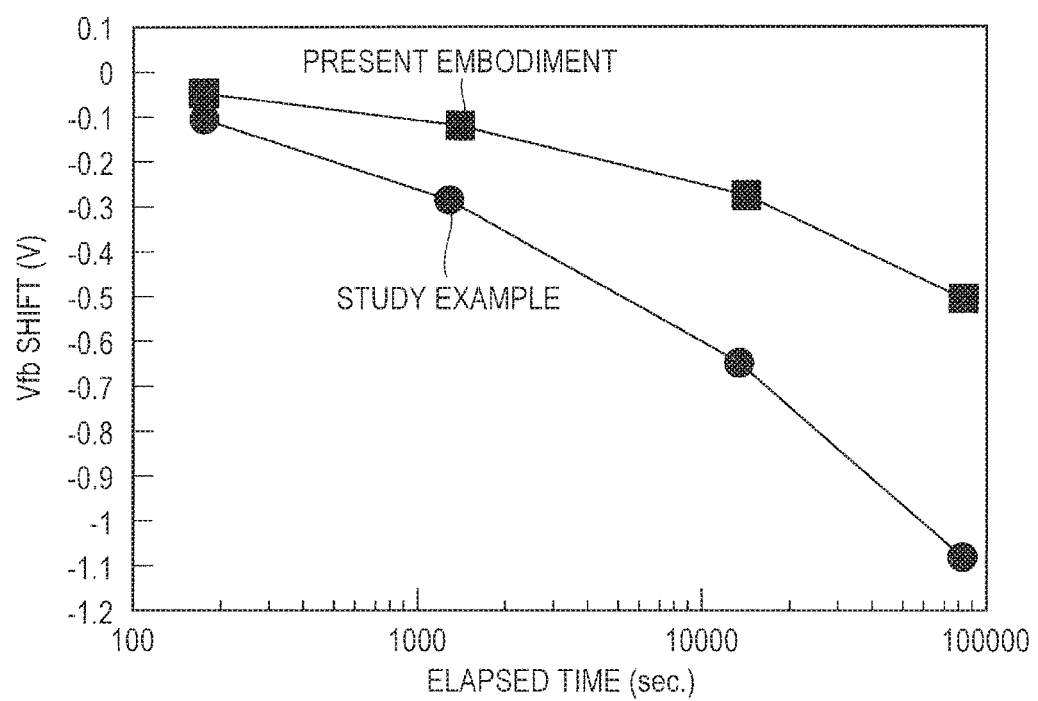
FIG. 36 is a graph showing the amount of fluctuations in flat band voltage of the memory element upon an elapse of a prescribed time after the write operation.

FIG. 36 is a graph showing the amount of fluctuations (shift amount) in flat band voltage Vfb of the memory element upon an elapse of a prescribed time after the write operation. The horizontal axis of the graph of FIG. 36 corresponds to the elapsed time after the write operation. The vertical axis of the graph of FIG. 36 corresponds to the amount of fluctuations (shift amount) in flat band voltage Vfb upon an elapse of a prescribed time after the write operation, and specifically corresponds to the difference between the flat band voltage immediately after the write operation and the flat band voltage after an elapse of a prescribed time after the write operation. Further, in the graph of FIG. 36, a black square mark (■) corresponds to the present embodiment, and herein shows the case where as the top insulation film of the gate insulation film (MZ) of memory element, a lamination film of an aluminum oxide film (corresponding to the insulation film MZ3), a silicon oxide film (corresponding to the insulation film MZ4), and an aluminum oxide film (corresponding to the insulation film MZ5) is used, where the aluminum oxide film is a polycrystal film. Further, in the graph of FIG. 36, a black circle mark (●) corresponds to the case of Study Example of FIG. 31, and herein shows the case where as the top insulation film (MZ103) of the gate insulation film (MZ100) of the memory element, a monolayer aluminum oxide film is used, where the aluminum oxide film is a polycrystal film. Incidentally, it should be noted that the vertical axis of the graph of FIG. 36 shows a larger amount of fluctuations in flat band voltage as going away from zero, namely, as going downward.

As shown in the graph of FIG. 36, (the absolute value of) the amount of fluctuations of the flat band voltage of the memory element upon elapse of a prescribed time after the write operation decreases (approaches zero) when a lamination film of an aluminum oxide film, a silicon oxide film, and an aluminum oxide film is used (corresponding to the present embodiment) than when a monolayer aluminum oxide film is used (corresponding to Study Example) as the top insulation film of the gate insulation film of the memory element. This can be considered due to the fact that the leakage between the gate electrodes (MG1 and MG2) and the charge accumulation film (MZ2) through grain boundaries is reduced. The graph of FIG. 36 also indicates that the retention characteristics of the memory element can be more improved in the case of the present embodiment (FIGS. 2, 15, 34, and 35) than in the case of Study Example (FIGS. 31 and 33).

Then, the preferable thicknesses of the insulation films MZ3, MZ4, and MZ5 will be described.

The insulation film MZ4 is provided in order to divide the crystal grains GR1 forming the insulation film MZ3 (polycrystal film) and the crystal grains GR2 forming the insulation film MZ5 (polycrystal film) by the insulation film MZ4. That is, in consideration of the problem (the problem described by reference to FIG. 33) caused when a monolayer polycrystal film is used as the top insulation film MZ103 as in the Study Example of FIG. 31, there is adopted a structure in which the insulation film MZ4 is inserted as a buffer layer in the film (halfway of the thickness) of the polycrystal film. For this reason, for the insulation films MZ3 and MZ5, a material suitable as a charge block layer is used, and for the insulation film MZ4, a material capable of providing an action of dividing the crystal grains GR1 forming the insulation film MZ3 and the crystal grains GR2 forming the insulation film MZ5 is used.

For this reason, the insulation film MZ4 should not be too thick so long as it can provide an action of dividing the crystal grains GR1 forming the insulation film MZ3 and the crystal grains GR2 forming the insulation film MZ5. The thickness of the lamination film LM is preferably ensured mainly by the thicknesses of the insulation films MZ3 and MZ5. From this point of view, the thickness (T2) of the insulation film MZ4 is preferably 1 nm or more, and particularly preferably 1 to 2 nm. This can provide an action of dividing the crystal grains GR1 forming the insulation film MZ3 and the crystal grains GR2 forming the insulation film MZ5 by the insulation film MZ4 with precision. Further, the thickness (T1) of the insulation film MZ3 and the thickness (T3) of the insulation film MZ5 are preferably respectively larger than the thickness (T2) of the insulation film MZ4. In other words, the thickness (T2) of the insulation film MZ4 is smaller than each of the thickness (T1) of the insulation film MZ3 and the thickness (T3) of the insulation film MZ5 (i.e., T2<T1 and T2<T3). As a result, the thickness of the lamination film LM can be ensured mainly by the thicknesses of the insulation films MZ3 and MZ5. Accordingly, it is possible to obtain the function of the lamination film LM as a charge block layer with more precision. Further, respective thicknesses (T1 and T3) of the insulation films MZ3 and MZ5 are each preferably 2 nm or more, and particularly preferably 2 to 5 nm. As a result, the insulation films MZ3 and MZ5 become more likely to be crystallized. This can also provide the effect of facilitating the improvement of the film quality of the insulation films MZ3 and MZ by crystallization. Incidentally, the thicknesses T1, T2, and T3 are shown in FIGS. 34 and 35.

Further, when the insulation film MZ4 is formed of the foregoing material (high dielectric constant material), as in FIG. 34, crystallization annealing can crystallize not only the insulation films MZ3 and MZ5 but also the insulation film MZ4, resulting in polycrystal films. However, when the insulation film MZ4 is made thin, upon crystallizing the insulation films MZ3 and MZ5 by crystallization annealing (Step S4 or S26), the insulation film MZ4 may be insufficiently crystallized, resulting in a microcrystalline state of the insulation film MZ4, or a state in which the insulation film MZ4 partially includes an amorphous region. Even in such a case, it is possible to provide an action of dividing the crystal grains GR1 forming the insulation film MZ3 and the crystal grains GR2 forming the insulation film MZ5 by the insulation film MZ4. However, more preferably, not only the insulation films MZ3 and MZ5, but also the entire insulation film MZ4 are polycrystallized, resulting in polycrystal films. As a result, not only the insulation films MZ3 and MZ5, but also the insulation film MZ4 are improved in film quality. Accordingly, all the films of the insulation films MZ3, MZ4, and MZ5 become films less susceptible to leakage. As a result, it is possible to more improve the retention characteristics of the memory element.

Furthermore, the case where the insulation film MZ3 is thinner than the insulation film MZ5, and the case where the insulation film MZ5 is thinner than the insulation film MZ3 can provide different advantages, respectively. This will be described below.

When the insulation film MZ3 is thick, in the charge holding state after the write operation, the amount of electric charges (herein, electrons) moving from the charge accumulation film (insulation film MZ2) into the insulation film MZ3 increases. Thus, the electric charge distribution at the insulation film MZ becomes more likely to change from immediately after the write operation. This acts so as to increase the amount of fluctuations in threshold voltage in the charge holding state after the write operation, which may lead to the degradation of the retention characteristics. For this reason, from the viewpoint of improving the retention characteristics as much as possible, the insulation film MZ3 is desirably thin. Therefore, the insulation film MZ3 is desirably thinner than the insulation film MZ5.

On the other hand, when the insulation film MZ5 is thick, the probability that electric charges (herein, electrons) are trapped from the gate electrodes (MG1 and MG2) into the insulation film MZ5 increases. Thus, electric charges (herein, electrons) become more likely to be trapped in the insulation film MZ5. With an increase in amount of electric charges (herein, electrons) to be trapped in the insulation film MZ5, the amount of electric charges (herein, holes) to be injected into the charge accumulation film (insulation film MZ2) at the time of erase operation increases. Accordingly, the erase characteristics may be reduced. For example, the length of time required for the erase operation may increase, or the erase voltage (the applied voltage at the time of erase operation) may increase. For this reason, from the viewpoint of improving the erase characteristics, the insulation film MZ5 is desirably thin. Therefore, the insulation film MZ5 is preferably thinner than the insulation film MZ3.

Therefore, when a priority is placed on the retention characteristics, the insulation film MZ3 is preferably set thinner than the insulation film MZ5. When a priority is placed on the erase characteristics, the insulation film MZ5 is preferably set thinner than the insulation film MZ3.

Up to this point, the invention completed by the present inventors has been described by way of embodiments thereof. However, it is naturally understood that the present invention is not limited to the embodiments, and may be variously changed within the scope not departing from the gist thereof.

What is claimed is:

1. A semiconductor device, comprising:
   a semiconductor substrate;
   a gate insulation film for a memory element formed over the semiconductor substrate; and
   a gate electrode for the memory element formed over the gate insulation film,
   wherein the gate insulation film has a first insulation film, a second insulation film over the first insulation film, a third insulation film over the second insulation film, a fourth insulation film over the third insulation film, and a fifth insulation film over the fourth insulation film,
   wherein the second insulation film is an insulation film having a charge accumulation function,
   wherein respective band gaps of the first insulation film and the third insulation film are larger than the band gap of the second insulation film,
   wherein the third insulation film is a polycrystal film formed of a high dielectric constant material containing a metallic element and oxygen, wherein the fifth insulation film is a polycrystal film formed of the same material as that for the third insulation film, and wherein the fourth insulation film is formed of a different material from that for the third insulation film.

2. The semiconductor device according to claim 1, wherein the third insulation film is an aluminum oxide film, an aluminum oxynitride film, or an aluminum silicate film.

3. The semiconductor device according to claim 1, wherein the third insulation film is an aluminum oxide film.

4. The semiconductor device according to claim 1, wherein the second insulation film is formed of a high dielectric constant material containing hafnium and oxygen.

5. The semiconductor device according to claim 1, wherein the second insulation film is a hafnium oxide film or a hafnium silicate film.

6. The semiconductor device according to claim 1, wherein the first insulation film is a silicon oxide film or a silicon oxynitride film.

7. The semiconductor device according to claim 1, wherein a plurality of first crystal grains forming the third insulation film, and a plurality of second crystal grains forming the fifth insulation film are separated by the fourth insulation film.

8. The semiconductor device according to claim 7, wherein the first crystal grains forming the third insulation film include third crystal grains adjacent to the second insulation film and the fourth insulation film, and wherein the second crystal grains forming the fifth insulation film include fourth crystal grains adjacent to the fourth insulation film and the gate electrode.

9. The semiconductor device according to claim 1, wherein the fourth insulation film is a polycrystal film formed of a high dielectric constant material.

10. The semiconductor device according to claim 1, wherein the fourth insulation film is a metal oxide film, a metal silicate film, or a metal oxynitride film.

11. The semiconductor device according to claim 1, wherein the fourth insulation film is an amorphous film.

12. The semiconductor device according to claim 1, wherein the fourth insulation film is a silicon oxide film, a silicon oxynitride film, or a silicon nitride film.

13. The semiconductor device according to claim 1, wherein the fourth insulation film is thinner than each of the third insulation film and the fifth insulation film.

14. The semiconductor device according to claim 13, wherein a thickness of the fourth insulation film is 1 nm or more.

15. The semiconductor device according to claim 14, wherein each thickness of the third insulation film and the fifth insulation film is 2 nm Or more.

16. The semiconductor device according to claim 13, wherein the third insulation film is thinner than the fifth insulation film.

17. The semiconductor device according to claim 13, wherein the fifth insulation film is thinner than the third insulation film.

18. A semiconductor device, comprising:

a semiconductor substrate;

a gate insulation film for a memory element formed over the semiconductor substrate; and a gate electrode for the memory element formed over the gate insulation film, wherein the gate insulation film has a first insulation film, a second insulation film over the first insulation film, a third insulation film over the second insulation film, a fourth insulation film over the third insulation film, and a fifth insulation film over the fourth insulation film, wherein the second insulation film is an insulation film having a charge accumulation function, wherein respective band gaps of the first insulation film and the third insulation film are larger than the band gap of the second insulation film, wherein the third insulation film is a polycrystal film formed of a high dielectric constant material containing a metallic element and oxygen, wherein the fifth insulation film is a polycrystal film formed of the same material as that for the third insulation film, and wherein the fourth insulation film is a polycrystal film having a different crystal structure from that of the third insulation film.

* * * * *